United States Patent
Mosden et al.

(10) Patent No.: US 7,097,779 B2
(45) Date of Patent: Aug. 29, 2006

(54) PROCESSING SYSTEM AND METHOD FOR CHEMICALLY TREATING A TERA LAYER

(75) Inventors: Aelan Mosden, Poughkeepsie, NY (US); Asao Yamashita, Wappingers Falls, NY (US)

(73) Assignee: Tokyo Electron Limited, Tokyo (JP)

( * ) Notice: Subject to any disclaimer, the term of this patent is extended or adjusted under 35 U.S.C. 154(b) by 57 days.

(21) Appl. No.: 10/883,784

(22) Filed: Jul. 6, 2004

(65) Prior Publication Data
US 2006/0006136 A1    Jan. 12, 2006

(51) Int. Cl.
*B44C 1/22* (2006.01)
*H01L 21/00* (2006.01)

(52) U.S. Cl. .............. 216/37; 216/2; 216/41; 216/58; 216/67; 216/69; 438/694; 438/710

(58) Field of Classification Search .......... 216/2, 216/41, 37, 58, 67, 69; 438/694, 710
See application file for complete search history.

(56) References Cited

U.S. PATENT DOCUMENTS

| | | | |
|---|---|---|---|
| 5,240,556 A | | 8/1993 | Ishikawa et al. |
| 6,013,574 A | * | 1/2000 | Hause et al. ............. 438/622 |
| 6,316,167 B1 | | 11/2001 | Angelopoulos et al. |
| 6,573,030 B1 | * | 6/2003 | Fairbairn et al. ........... 430/323 |
| 6,750,127 B1 | | 6/2004 | Chang et al. |
| 2004/0038537 A1 | | 2/2004 | Liu et al. |
| 2004/0087092 A1 | | 5/2004 | Huang et al. |
| 2005/0106888 A1 | * | 5/2005 | Chiu et al. .................. 438/710 |

FOREIGN PATENT DOCUMENTS

| | | |
|---|---|---|
| DE | 102 23 954 A1 | 12/2003 |
| JP | 07-283216 | 10/1995 |
| WO | WO 03/007344 | 1/2003 |
| WO | WO 03/007357 A1 | 1/2003 |

OTHER PUBLICATIONS

Matthew Sendelbach et al., "Feedforward of mask open measurements on an integrated scatterometer to improve gate linewidth control", Proceedings of the SPIE, SPIE (Bellingham, WA), vol. 5375, pp. 686-702, (May 24, 2004).

* cited by examiner

*Primary Examiner*—Shamim Ahmed
(74) *Attorney, Agent, or Firm*—Pillsbury Winthrop Shaw Pittman LLP

(57) ABSTRACT

A processing system and method for chemically treating a TERA layer on a substrate. The chemical treatment of the substrate chemically alters exposed surfaces on the substrate. In one embodiment, the system for processing a TERA layer includes a plasma-enhanced chemical vapor deposition (PECVD) system for depositing the TERA layer on the substrate, an etching system for creating features in the TERA layer, and a processing subsystem for reducing the size of the features in the TERA layer.

21 Claims, 9 Drawing Sheets

PROCESSING SYSTEM AND METHOD FOR CHEMICALLY TREATING A TERA LAYER

CROSS-REFERENCE TO RELATED APPLICATIONS

This application is related to co-pending U.S. patent application Ser. No. 10/705,201, entitled "Processing System and Method for Treating a Substrate", filed on Nov. 12, 2003; co-pending U.S. patent application Ser. No. 10/704,969, entitled "Processing System and Method for Thermally Treating a Substrate", filed Nov. 12, 2003; co-pending U.S. patent application Ser. No. 10/705,397, entitled "Method and Apparatus for Thermally Insulating Adjacent Temperature Controlled Chambers", filed on Nov. 12, 2003; and co-pending U.S. patent application Ser. No. 10/644,958, entitled "Method and Apparatus For Depositing Materials With Tunable Optical Properties And Etching Characteristics", filed on Aug. 21, 2003. The contents of each of those applications are herein incorporated by reference in their entireties.

BACKGROUND OF THE INVENTION

1. Field of the Invention

The present invention relates to a system and method for treating a Tunable Etch Rate ARC (TERA) layer, and more particularly to a system and method for chemical treatment of a TERA layer.

2. Description of the Related Art

During semiconductor processing, a (dry) plasma etch process can be utilized to remove or etch material along fine lines or within vias or contacts patterned on a silicon substrate. The plasma etch process generally involves positioning a semiconductor substrate with an overlying patterned, protective layer, for example a photoresist layer, in a processing chamber. Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a fraction of the gas species present are ionized by electrons heated via the transfer of radio frequency (RF) power either inductively or capacitively, or microwave power using, for example, electron cyclotron resonance (ECR). Moreover, the heated electrons serve to dissociate some species of the ambient gas species and create reactant specie(s) suitable for the exposed surface etch chemistry. Once the plasma is formed, selected surfaces of the substrate are etched by the plasma. The process is adjusted to achieve appropriate conditions, including an appropriate concentration of desirable reactant and ion populations to etch various features (e.g., trenches, vias, contacts, gates, etc.) in the selected regions of the substrate. Such substrate materials where etching is required include silicon dioxide ($SiO_2$), low-k dielectric materials, poly-silicon, and silicon nitride. During material processing, etching such features generally comprises the transfer of a pattern formed within a mask layer to the underlying film within which the respective features are formed. The mask can, for example, comprise a light-sensitive material such as (negative or positive) photo-resist, multiple layers including such layers as photo-resist and an anti-reflective coating (ARC), or a hard mask formed from the transfer of a pattern in a first layer, such as photo-resist, to the underlying hard mask layer.

SUMMARY OF THE INVENTION

The principles of the present invention, as embodied and broadly described herein, provide a method of processing a Tunable Etch Rate ARC (TERA) layer on a substrate. The TERA layer processing method includes depositing the TERA layer on the substrate using a plasma enhanced chemical vapor deposition (PECVD) system, creating features in the TERA layer using an etching system, and reducing the size of the features in the TERA layer.

Additionally, a system for processing a TERA layer is presented. The system includes a plasma enhanced chemical vapor deposition (PECVD) system for depositing the TERA layer on the substrate, an etching system for creating features in the TERA layer, and a processing subsystem for reducing the size of the features in the TERA layer.

Numerous other aspects of the invention will be made apparent from the description that follows and from the drawings appended hereto, as would be appreciated by those skilled in the art.

BRIEF DESCRIPTION OF THE DRAWINGS

Embodiments of the invention will now be described, by way of example only, with reference to the accompanying schematic drawings, in which corresponding reference symbols indicate corresponding parts, and in which.

DETAILED DESCRIPTION

In material processing methodologies, pattern etching comprises the application of a thin layer of light-sensitive material, such as photoresist, to an upper surface of a substrate that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, comprise a TERA layer that can be selected from several materials for silicon processing including silicon dioxide ($SiO_2$), silicon nitride ($Si_3N_4$), and carbon, for example.

In order to reduce the feature size formed in the thin film, the hard mask can be trimmed laterally using, for example, a two-step process involving a chemical treatment of the exposed surfaces of the hard mask layer in order to alter the surface chemistry of the hard mask layer, and a post treatment of the exposed surfaces of the hard mask layer in order to desorb the altered surface chemistry.

Figure 1:
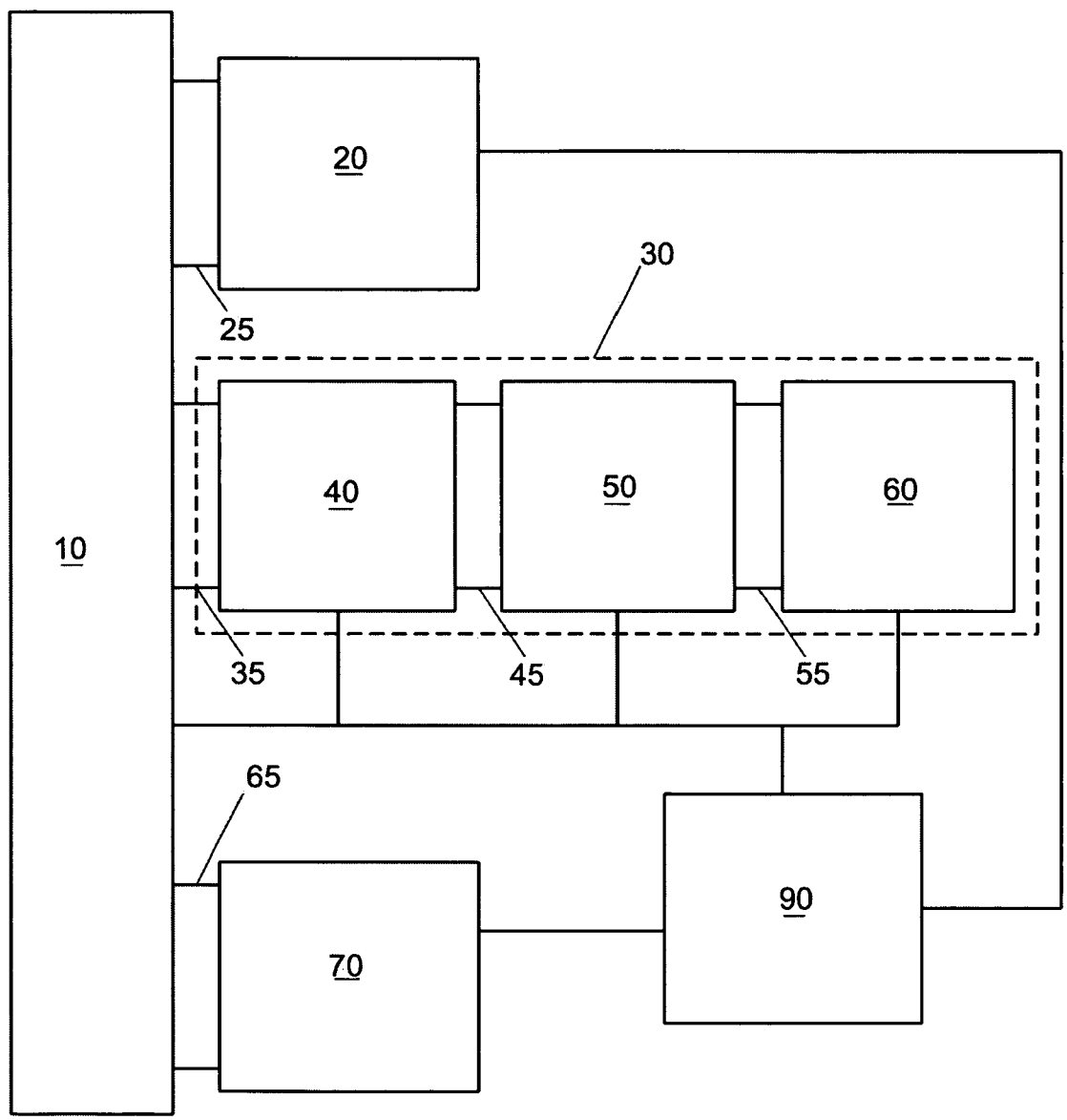
FIG. 1 illustrates a schematic representation of a processing system according to an embodiment of the invention.

FIG. 1 illustrates a schematic representation of a processing system according to an embodiment of the invention. In the illustrated embodiment, a processing system 1 for processing a substrate using, for example, TERA layer trimming is shown. Processing system 1 can comprise a multi-element manufacturing system 10, a deposition system 20 coupled to the multi-element manufacturing system 10, a treatment system 30 coupled to the multi-element manufacturing system 10, and an etching system 70 coupled to the multi-element manufacturing system 10.

The treatment system 30 can comprise a transfer module 40, a thermal treatment module 50, and a chemical treatment module 60. Also, as illustrated in FIG. 1, the transfer module 40 can be coupled to the thermal treatment module 50 in order to transfer substrates into and out of the thermal treatment module 50 and the chemical treatment module 60, and exchange substrates with a multi-element manufacturing system 10.

As should be apparent to those skilled in the art, the multi-element manufacturing system 10 can comprise additional processing elements (not shown) including such devices as etch systems, deposition systems, coating systems, cleaning systems, polishing systems, patterning systems, metrology systems, alignment systems, lithography systems, and transfer systems. Also, the multi-element manufacturing system 10 can permit the transfer of substrates to and from the processing elements (20, 30, and 70) and the additional processing elements (not shown).

As should be appreciated by those skilled in the art, the exact type and arrangement of components for processing system 1 may vary without departing from the scope of the invention. As such, processing system 1 is not limited solely to components 20, 30, 40, 50, 60 and 70 as described or the layout depicted. The invention is intended to encompass a plethora of variations too numerous to list here.

In one embodiment, deposition system 20 can comprise a chemical vapor deposition (CVD) system, a plasma enhanced chemical vapor deposition (PECVD) system, a physical vapor deposition (PVD) system, an ionized physical vapor deposition (iPVD) system, or an atomic layer deposition (ALD) system, or a combination of two or more thereof. The process gas can comprise an oxygen-containing gas, a nitrogen containing gas, a fluorine-containing gas, or a chlorine-containing gas, or a combination of two or more thereof. Alternately, an inert gas can also be included.

For example, an oxygen-containing gas can comprise $O_2$, CO, NO, $N_2O$, or $CO_2$, or a combination of two or more thereof. The nitrogen-containing gas can comprise NO, $N_2O$, $N_2$, or $NF_3$, or a combination of two or more thereof. The fluorine-containing gas can comprise $NF_3$, $SF_6$, $CHF_3$, or $C_4F_8$, or a combination of two or more thereof. It will be appreciated that similar combinations to the fluorine-containing gas can be used for the chlorine-containing gas. Moreover, hybrids of gas containing both fluorine and chlorine may be employed.

The flow rate for an oxygen-containing gas can vary from approximately 0 sccm to approximately 500 sccm and alternately from approximately 0 sccm to approximately 300 sccm. The flow rate for an nitrogen-containing gas can vary from approximately 0 sccm to approximately 200 sccm and alternately from approximately 0 sccm to approximately 100 sccm. The flow rate for a fluorine-containing gas can vary from approximately 0 sccm to approximately 200 sccm and alternately from approximately 0 sccm to approximately 100 sccm. The flow rate for a chlorine-containing gas can vary from approximately 0 sccm to approximately 200 sccm and alternately from approximately 0 sccm to approximately 100 sccm.

In order to isolate the processes occurring in the deposition system 20, an isolation assembly 25 can be utilized to couple the deposition system 20 to the multi-element manufacturing system 10. The isolation assembly 25 can comprise a thermal insulation assembly to provide thermal isolation and/or a gate valve assembly to provide vacuum isolation. In alternate embodiments, the processing element 20 can comprise multiple modules.

As indicated above, in one embodiment, the treatment system 30 can comprise the transfer module 40, the thermal treatment module 50, which may be a physical heat treatment (PHT) module, and the chemical treatment module 60, which may be a chemical oxide removal (COR) module. In order to isolate the processes occurring in the different modules, isolation assemblies 35, 45, 55 can be utilized to couple the different modules. The isolation assembly 35 can be used to couple the transfer module 40 to the multi-element manufacturing system 10; the isolation assembly 45 can be used to couple the transfer module 40 to the PHT module 50; and the isolation assembly 55 can be used to couple the PHT module 50 to the COR module 60. The isolation assemblies 35, 45, 55 can comprise a thermal insulation assembly to provide thermal isolation and/or a gate valve assembly to provide vacuum isolation. In alternate embodiments, a different number of isolation assemblies 35, 45, 55 can be used.

In general, the transfer module 40 and/or the PHT module 50 of the processing system 1 depicted in FIG. 1 can comprise at least two transfer openings to permit the passage of the substrate therethrough. For example, as depicted in FIG. 1, the PHT module 50 comprises two transfer openings. The first transfer opening permits the passage of the substrate between the PHT module 50 and the transfer system 40, and the second transfer opening permits the passage of the substrate between the PHT module 50 and the COR module 60. Alternately, each treatment system element can comprise at least one transfer opening to permit the passage of the substrate therethrough.

In one embodiment, the transfer system 40, the PHT module 50, and the COR module 60 can be configured as in-line elements. Alternately, the transfer system 40, the PHT module 50, and the COR module 60 can be configured in any number of arrangements. For example, a stacked arrangement or a side-by-side arrangement can be used.

In one embodiment, the etching system 70 can comprise a dry etching system and/or a wet etching system. For example, the etching system 70 can comprise a plasma etching system. In order to isolate the processes occurring in the etching system 70, an isolation assembly 65 can be utilized to couple the etching system 70 to the multi-element manufacturing system 10. The isolation assembly 65 can comprise a thermal insulation assembly to provide thermal isolation and/or a gate valve assembly to provide vacuum isolation. In alternate embodiments, the etching system 70 can comprise multiple modules.

In the embodiment shown in FIG. 1, a controller 90 can be coupled to the multi-element manufacturing system 10, the deposition system 20, the transfer module 40, the PHT module 50, the COR module 60, and the etching system 70. For example, the controller 90 can be used to control the multi-element manufacturing system 10, the deposition system 20, the transfer module 40, the PHT module 50, the COR module 60, and the etching system 70. The controller 90 can also be connected to various components in any of a number of different ways without departing from the scope of the invention.

Additionally, the multi-element manufacturing system 10 can exchange substrates with one or more substrate cassettes (not shown). Additionally, for example, an isolation assembly can serve as part of a processing element.

Figure 2:
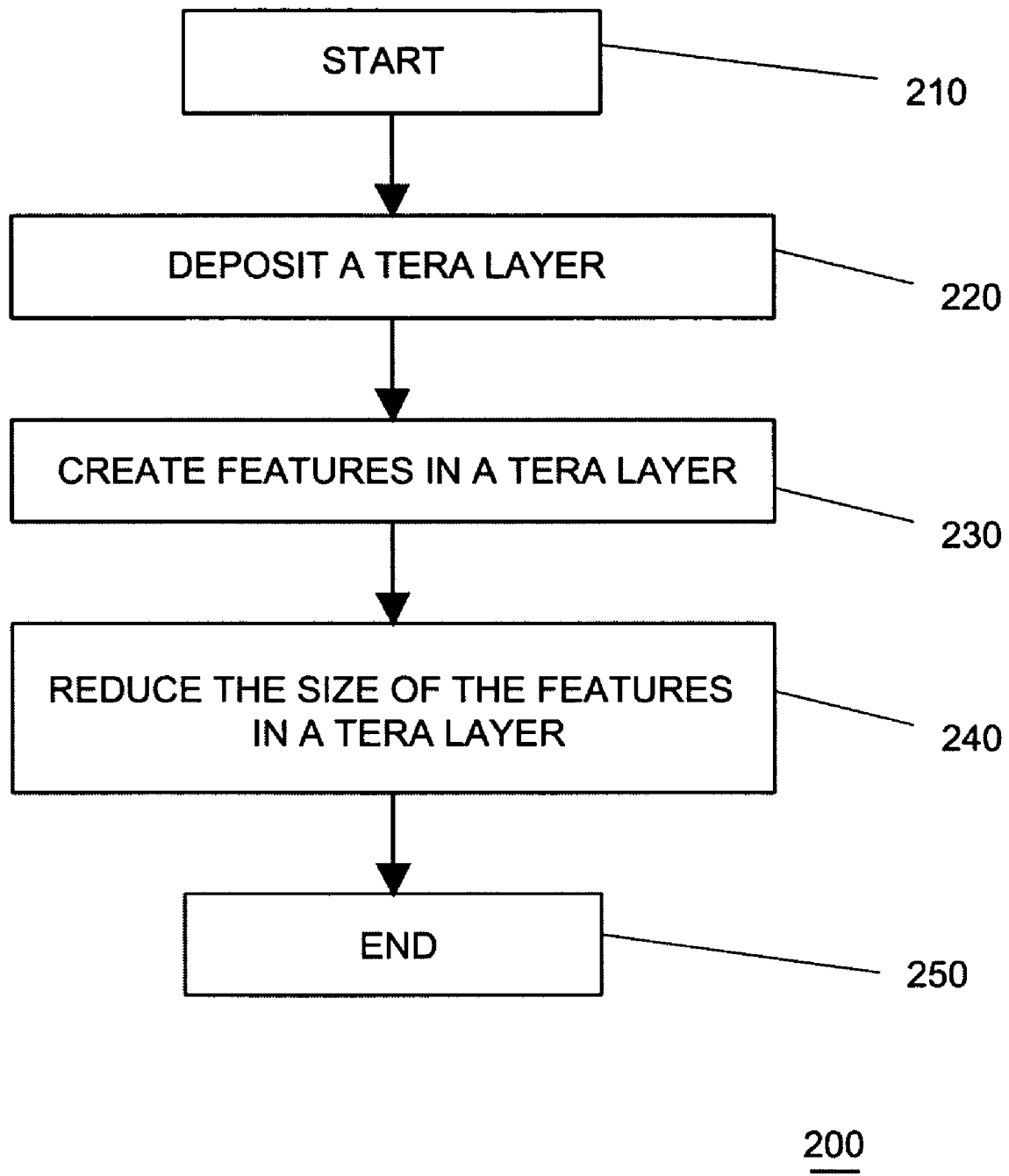
FIG. 2 illustrates a simplified flow diagram of a method for operating a processing system in accordance with an embodiment of the invention.

FIG. 2 illustrates a simplified flow diagram of a method for operating a processing system in accordance with an embodiment of the invention. In the illustrated embodiment, a procedure is shown for reducing the size of features on a TERA layer.

Procedure 200 begins at task 210. In task 220, a TERA layer is deposited on a substrate. TERA layers can be deposited on top of many different layers of a substrate. For example, a TERA layer can be deposited on an oxide layer, a dielectric layer, or a metallic layer. The deposition of the TERA layer is discussed in greater detail herein.

Features are then created in a TERA layer, as indicated by task 230. In one embodiment, a photoresist layer can be deposited on the TERA layer and a pattern may be transferred into the photoresist layer using at least one photolithography step. The pattern can be developed to form features in the photoresist layer; and an etching process can be used to create features in the TERA layer. In an alternate embodiment, a hard mask layer can be deposited on the TERA layer.

While performing process 200, a stabilization step can be performed before and/or after an individual processing step. Alternately, the stabilization step may be avoided altogether.

Stabilization processes may encompass a variety of operational parameters, such as process time and chamber pressure. For example, the process time can vary from approximately 2 seconds to approximately 150 seconds and alternately from approximately 4 seconds to approximately 15 seconds. The chamber pressure can vary from approximately 2 mTorr to approximately 800 mTorr and alternately from approximately 10 mTorr to approximately 90 mTorr.

As discussed at length above, the process gas can comprise an oxygen-containing gas, a nitrogen containing gas, a fluorine-containing gas, or a chlorine-containing gas, or a combination of two or more thereof. Alternately, an inert gas can also be included. For example, an oxygen-containing gas can comprise $O_2$, CO, NO, $N_2O$, or $CO_2$, or a combination of two or more thereof; the nitrogen-containing gas can comprise NO, $N_2O$, $N_2$, or $NF_3$, or a combination of two or more thereof; and the fluorine-containing gas can comprise $NF_3$, $SF_6$, $CHF_3$, or $C_4F_8$, or a combination of two or more thereof. The chlorine-containing gas can comprise similar combinations as the fluorine-containing gas.

The flow rate for an oxygen-containing gas can vary from approximately 0 sccm to approximately 500 sccm and alternately from approximately 0 sccm to approximately 300 sccm. The flow rate for an nitrogen-containing gas can vary from approximately 0 sccm to approximately 200 sccm and alternately from approximately 0 sccm to approximately 100 sccm. The flow rate for a fluorine-containing gas can vary from approximately 0 sccm to approximately 200 sccm and alternately from approximately 0 sccm to approximately 100 sccm. The flow rate for a chlorine-containing gas can vary from approximately 0 sccm to approximately 200 sccm and alternately from approximately 0 sccm to approximately 100 sccm.

In one embodiment, a photoresist trim process can be performed. Alternately, the photoresist trim process can be avoided altogether. Photoresist processes may also encompass a variety of operational parameters, such as process time and chamber pressure. For example, the process time can vary from approximately 0 seconds to approximately 180 seconds and alternately from approximately 10 seconds to approximately 40 seconds. The chamber pressure can vary from approximately 10 mTorr to approximately 120 mTorr and alternately from approximately 10 mTorr to approximately 90 mTorr. Also, as discussed above, the process gas can comprise an oxygen-containing gas, a nitrogen-containing gas and/or an inert gas. And, the flow rates for an oxygen-containing gas can vary from approximately 0 sccm to approximately 500 sccm and alternately from approximately 0 sccm to approximately 300 sccm, while the flow rates for a nitrogen-containing gas can vary from approximately 0 sccm to approximately 1000 sccm and alternately from approximately 0 sccm to approximately 200 sccm.

RF power can be supplied to an upper electrode and the upper RF power can vary from approximately 0 watts to approximately 1500 watts and alternately from approximately 100 watts to approximately 300 watts. In addition, RF power can be supplied to a lower electrode and the lower RF power can vary from approximately 0 watts to approximately 500 watts and alternately from approximately 40 watts to approximately 150 watts.

In one embodiment, a TERA cap etch process can be performed. Alternately, the TERA cap etch process may be avoided altogether. The TERA cap etch process may also encompass a variety of operational parameters, such as process time and chamber pressure. For example, the process time can vary from approximately 0 seconds to approximately 50 seconds and alternately from approximately 0 seconds to approximately 18 seconds. The chamber pressure can vary from approximately 10 mTorr to approximately 120 mTorr and alternately from approximately 10 mTorr to approximately 90 mTorr.

Also, as discussed above, the process gas can comprise an oxygen-containing gas, a nitrogen-containing gas, a fluorine-containing gas, or a chlorine-containing gas, an inert gas, or a combination of two or more thereof. And the flow rate for an oxygen-containing gas can vary from approximately 0 sccm to approximately 500 sccm and alternately from approximately 0 sccm to approximately 300 sccm. The flow rate for a nitrogen-containing gas can vary from approximately 0 sccm to approximately 200 sccm and alternately from approximately 0 sccm to approximately 100 sccm. The flow rate for a fluorine-containing gas can vary from approximately 0 sccm to approximately 200 sccm and alternately from approximately 0 sccm to approximately 100 sccm. The flow rate for a chlorine-containing gas can vary from approximately 0 sccm to approximately 200 sccm and alternately from approximately 0 sccm to approximately 100 sccm.

In task 240, the size of the features in the TERA layer can be reduced. In one embodiment, the exposed surfaces of the features in the TERA layer can be oxidized, and a removal process can be performed to remove at least a part of the oxidized portion of the TERA features. A trimming amount can be established and the oxidation process can be controlled so that the correct trimming amount is achieved. During a removal process, a chemical oxide removal (COR) process can be performed. In an alternate embodiment, the oxidation process and the COR process can be performed a number of times to reduce the size of the features in the TERA layer to predetermined dimensions.

During an exemplary TERA oxidation process, the process time can vary from approximately 0 seconds to approximately 180 seconds and alternately from approximately 0 seconds to approximately 18 seconds. The chamber pressure can vary from approximately 10 mtorr to approximately 300 mtorr and alternately from approximately 150 mtorr to approximately 250 mtorr. The process gas can comprise an oxygen-containing gas. Alternately, an inert gas can also be included. The flow rate for an oxygen-containing gas can vary from approximately 0.0 sccm to approximately 500 sccm and alternately from approximately 150 sccm to approximately 300 sccm. RF power can be supplied to an upper electrode and the upper RF power can vary from approximately 0.0 watts to approximately 1500 watts and alternately from approximately 200 watts to approximately 400 watts. In addition, RF power can be supplied to a lower electrode and the lower RF power can vary from approximately 0.0 watts to approximately 500 watts and alternately from approximately 30 watts to approximately 100 watts.

During the oxidation process, the TERA layer can be partially or fully oxidized. For example, TERA layers ranging from approximately 1 nm to approximately 5 nm can be fully oxidized in less than 12 seconds. The COR process does not remove non-oxidized TERA material. The COR process can be used to remove all or part of the oxidized TERA layer, as would be appreciated by those skilled in the art.

For example, the transfer module 40, the PHT module 50, and the COR module 60 can be used to perform a removal process. The removal process can use a COR recipe to perform the processing and the COR recipe can begin when a substrate is transferred to the COR module. The substrate can be received by lift pins that are housed within a substrate holder, and the substrate can be lowered to the substrate holder. Thereafter, the substrate can be secured to the substrate holder using a clamping system, such as an electrostatic clamping system, and a heat transfer gas can be supplied to the backside of the substrate.

Next, the COR recipe can be used to set one or more chemical processing parameters for the chemical treatment of the substrate, and these parameters can include a chemical treatment processing pressure, a chemical treatment wall temperature, a chemical treatment substrate holder temperature, a chemical treatment substrate temperature, a chemical treatment gas distribution system temperature, a chemical treatment process gas, or a chemical treatment process gas flow rate, or a combination of two or more thereof. Then, the substrate can be chemically treated for a first period of time. The first period of time can range from 30 to 360 seconds, for example.

Next, the substrate can be transferred from the chemical treatment chamber to the PHT module 50. During which time, the substrate clamp can be removed, and the flow of heat transfer gas to the backside of the substrate can be terminated. The substrate can be vertically lifted from the substrate holder to the transfer plane using the lift pin assembly housed within the substrate holder. The transfer system can receive the substrate from the lift pins and can position the substrate within the PHT module. Therein, a substrate lifter assembly can receive the substrate from the transfer system, and can lower the substrate to the substrate holder.

Then, the PHT recipe can be used to set one or more thermal processing parameters for thermal treatment of the substrate by the PHT module. In the PHT recipe, the substrate can be treated thermally for a second period of time. For example, the one or more thermal processing parameters can comprise a thermal treatment wall temperature, a thermal treatment upper assembly temperature, a thermal treatment substrate temperature, a thermal treatment substrate holder temperature, a thermal treatment substrate temperature, a thermal treatment processing pressure, a thermal treatment process gas, or a thermal treatment process gas flow rate, or a combination of two or more thereof. The second period of time can range from 30 to 360 seconds, for example.

In an exemplary process, the treatment system 30 can comprise a chemical oxide removal (COR) system for trimming an oxidized TERA film. The treatment system 30 can comprise the COR module 50 for chemically treating exposed surface layers, such as oxidized surface layers, on a substrate, whereby adsorption of the process chemistry on the exposed surfaces affects a chemical alteration of the surface layers. Additionally, the treatment system 30 can comprise the PHT module 60 for thermally treating the substrate, whereby the substrate temperature is elevated in order to desorb (or evaporate) the chemically altered exposed surfaces on the substrate.

In one embodiment, a COR module can use a process gas comprising HF and $NH_3$, and the processing pressure can range from approximately 1 to approximately 100 mTorr and, for example, can range from approximately 2 to approximately 25 mTorr. The process gas flow rates can range from approximately 1 to approximately 200 sccm for each specie and, for example, can range from approximately 10 to approximately 100 sccm. In addition, a substantially uniform pressure field can be achieved. Additionally, the COR module chamber can be heated to a temperature ranging from 30° to 100° C. and, for example, the temperature can be approximately 40° C. Additionally, the gas distribution system can be heated to a temperature ranging from approximately 40° to approximately 100° C. and, for example, the temperature can be approximately 50° C. The substrate can be maintained at a temperature ranging from approximately 10° to approximately 50° C. and, for example, the substrate temperature can be approximately 20° C.

In addition, in the PHT module 50, the thermal treatment chamber can be heated to a temperature ranging from approximately 50° to approximately 100° C. and, for example, the temperature can be approximately 80° C. Additionally, the upper assembly can be heated to a temperature ranging from approximately 50° to approximately 100° C. and, for example, the temperature can be approximately 80° C. The substrate can be heated to a temperature in excess of approximately 100° C. Alternatively, the substrate can be heated in a range from approximately 100° to approximately 200° C., and, for example, the temperature can be approximately 135° C.

The COR and PHT processes described herein can produce an etch amount of an exposed oxidized surface in excess of approximately 10 nm per 60 seconds of chemical treatment for oxidized TERA. The treatments can also produce an etch variation across the substrate of less than approximately 2.5 percent.

Figure 3A:
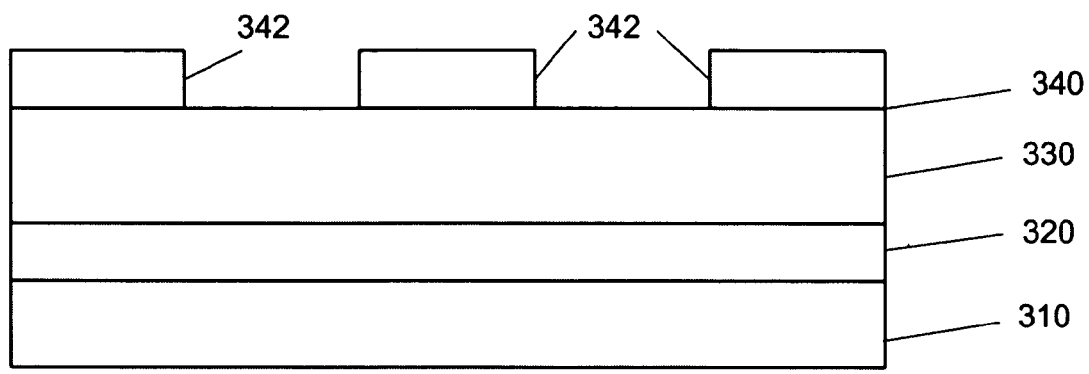
FIGS. 3A–3F illustrate simplified schematic views of a method for processing a substrate in accordance with an embodiment of the invention.

FIGS. 3A–3F illustrate simplified schematic views of a method for processing a substrate in accordance with an embodiment of the invention. In FIG. 3A, a simplified schematic view of a partially processed semiconductor device is shown. In the illustrated embodiment, the semiconductor device has been processed using a photoresist development process and an etch process. A substrate layer 310 is shown, and the substrate layer can comprise silicon (Si), germanium (Ge), or gallium arsenide (GaAs), or a combination of two or more thereof. An additional layer 320 is shown on top of the substrate layer 310. The additional layer can comprise one or more layers and each layer can comprise an oxide, a metal, or a dielectric material, or a combination of two or more thereof.

A TERA layer 330 is shown on top of the additional layer, and the TERA layer can comprise TERA features 332. In addition, a photoresist layer 340 is shown on top of the TERA layer 330, and the photoresist layer 340 can comprise photoresist features 342. For example, the photoresist features 342 can be produced when the photoresist layer is developed, and the TERA features 332 can be produced when the photoresist features 342 are transferred into the TERA layer 330 using an etch process.

Figure 3B:
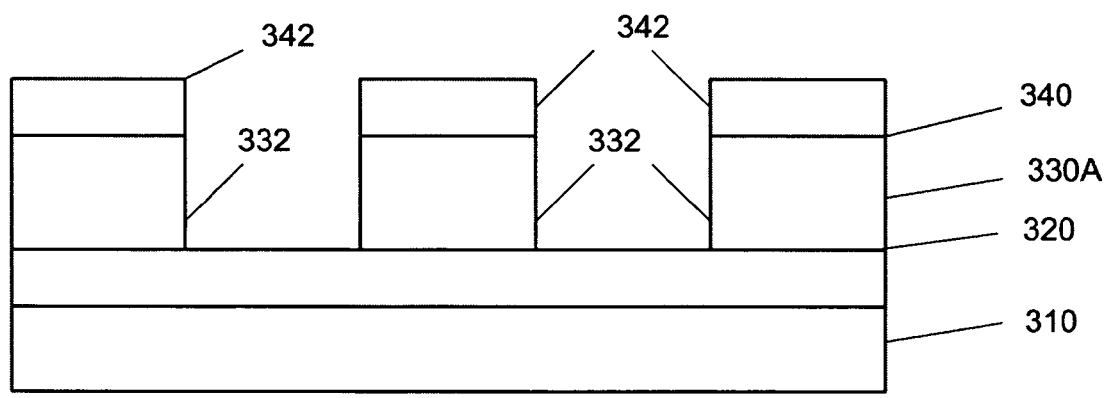

In FIG. 3B, another simplified schematic view of a partially processed semiconductor device is shown. In the illustrated embodiment, the semiconductor device has been processed using an etching process. Features 332 have been created in the TERA layer 330A by transferring the photoresist features 342 using an etch process. A substrate layer 310 is shown, and the substrate layer can comprise of silicon (Si), germanium (Ge), or gallium arsenide (GaAs), or a combination of two or more thereof. An additional layer 320 is shown on top of the substrate layer 310. The additional layer can comprise one or more layers and each layer can comprise an oxide, a metal, or a dielectric material, or a combination of two or more thereof.

A processed (etched) TERA layer 330A is shown on top of the additional layer, and the processed TERA layer 330A can comprise features 332. In addition, a photoresist layer 340 is shown on top of the processed TERA layer 330A, and the photoresist layer 340 can comprise photoresist features 342.

Figure 3C:
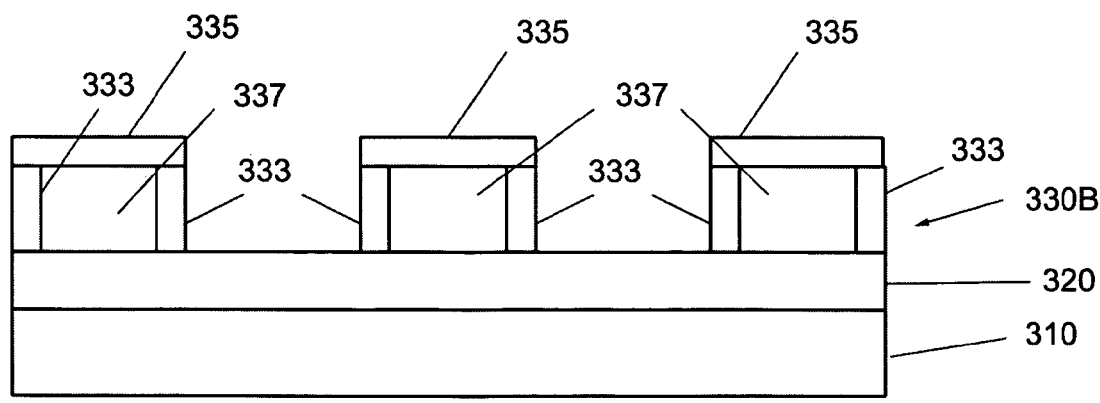

In FIG. 3C, another simplified schematic view of a partially processed semiconductor device is shown. In the illustrated embodiment, the semiconductor device has been processed using an oxidation process. The photoresist features have been removed by the oxidation (ashing) process, and oxidized areas 333 and 335 have been created in the TERA features 332 in the TERA layer 330B. The oxidized areas 333 on the sides of the TERA feature can have a different thickness than the oxidized areas 335 on the top of the TERA features. For example, the top portion of the TERA layer can comprise a cap portion that has a higher resistance to etching than the other portions of the TERA layer.

In FIG. 3C, a substrate layer 310 is shown, and the substrate layer can comprise silicon (Si), germanium (Ge), or gallium arsenide (GaAs), or a combination of two or more thereof. An additional layer 320 is shown on top of the substrate layer 310. The additional layer can comprise one or more layers and each layer can comprise an oxide, a metal, or a dielectric material, or a combination of two or more thereof. A processed TERA layer 330B is shown on top of the additional layer, and the processed TERA layer 330B can comprise features 332 having oxidized areas 333 and 335.

Figure 3D:
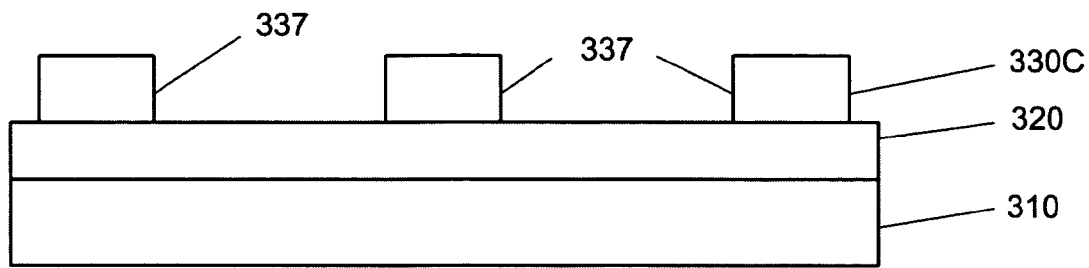

In FIG. 3D, another simplified schematic view of a partially processed semiconductor device is shown. In the illustrated embodiment, the semiconductor device has been processed using a COR process. Oxidized areas have been removed creating reduced TERA features 337 in the TERA layer 330C by removing the oxidized areas of the TERA features using a COR process. A substrate layer 310 is shown, and the substrate layer can comprise silicon (Si), germanium (Ge), or gallium arsenide (GaAs), or a combination of two or more thereof. An additional layer 320 is shown on top of the substrate layer 310. The additional layer can comprise one or more layers and each layer can comprise an oxide, a metal, or a dielectric material, or a combination of two or more thereof. A processed TERA layer 330C is shown on top of the additional layer, and the processed TERA layer 330C can comprise reduced size TERA features 337.

Figure 3E:
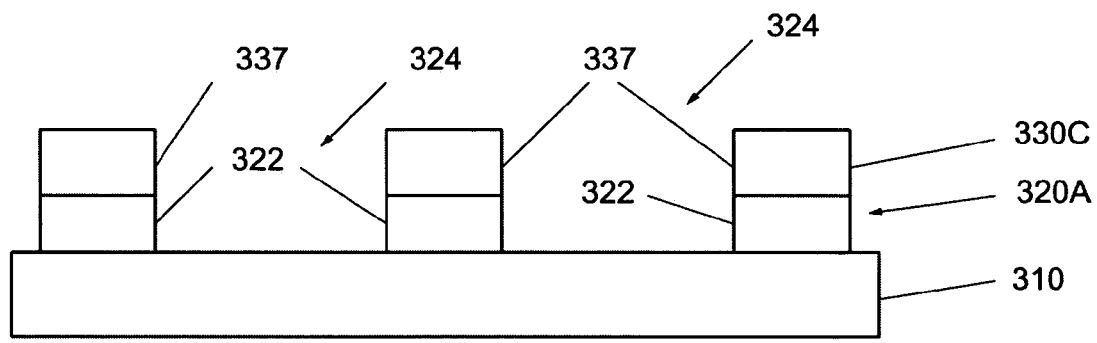

In FIG. 3E, another simplified schematic view of a partially processed semiconductor device is shown. In the illustrated embodiment, the semiconductor device has been processed using an etch process, and one or more of the layers in the additional layer 320 has been etched using the reduced size TERA features 337 as a mask. The reduced size TERA features 337 can be used as mask features and a dry etching process and/or a wet etching process can be performed. A substrate layer 310 is shown, and the substrate layer can comprise silicon (Si), germanium (Ge), or gallium arsenide (GaAs), or a combination of two or more thereof.

A processed (etched) additional layer 320A is shown on top of the substrate layer 310. The processed (etched) additional layer 320A can comprise vias 324 and additional layer features 322. The additional layer features 322 can comprise one or more layers and each layer can comprise an oxide, a metal, or a dielectric material, or a combination of two or more thereof. A processed (partially etched) TERA layer 330C is shown on top of the additional layer, and the processed (partially etched) TERA layer 330C can comprise reduced size TERA features 337. For example, the additional layer features can comprise a nitride layer and a doped poly layer.

Figure 3F:
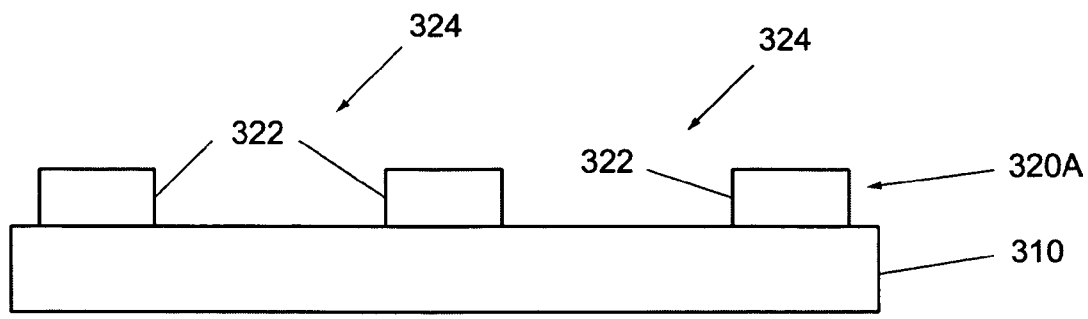

In FIG. 3F, another simplified schematic view of a partially processed semiconductor device is shown. In the illustrated embodiment, the semiconductor device has been processed using a removal process, and the reduced size TERA features 337 have been removed. A substrate layer 310 is shown, and the substrate layer can comprise silicon (Si), germanium (Ge), or gallium arsenide (GaAs), or a combination of two or more thereof. A processed (etched) additional layer 320A is shown on top of the substrate layer 310. The processed (etched) additional layer 320A can comprise vias 324 and additional layer features 322. The additional layer features 322 can comprise one or more layers and each layer can comprise an oxide, a metal, or a dielectric material, or a combination of two or more thereof. In this manner, reduced size features can be created in the additional layer and smaller critical dimensions (gate widths) can be achieved. In one embodiment, further processing can be performed.

FIGS. 4A–4G illustrate simplified schematic views of a method for processing a substrate in accordance with another embodiment of the invention.

Figure 4A:
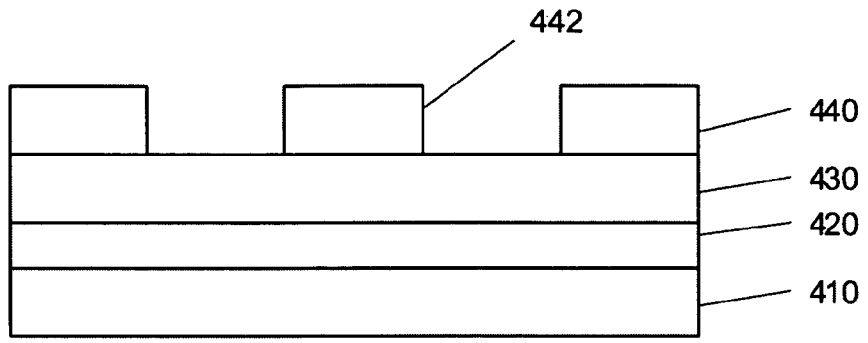
FIGS. 4A–4G illustrate simplified schematic views of a method for processing a substrate in accordance with another embodiment of the invention.

In FIG. 4A, a simplified schematic view of a partially processed semiconductor device is shown. In the illustrated embodiment, the semiconductor device has been processed using a hard mask development process. A substrate layer 410 is shown, and the substrate layer can comprise silicon (Si), germanium (Ge), or gallium arsenide (GaAs), or a combination of two or more thereof. An additional layer 420 is shown on top of the substrate layer 410. The additional layer can comprise one or more layers, and each layer can comprise an oxide, a metal, or a dielectric material, or a combination of two or more thereof. A TERA layer 430 is shown on top of the additional layer, and the TERA layer can be used as a hard mask. In addition, a hard mask layer 440 is shown on top of the TERA layer 430, and the hard mask layer 440 can comprise hard mask features 442. For example, the hard mask features 442 can be produced using a photoresist layer (not shown).

Figure 4B:
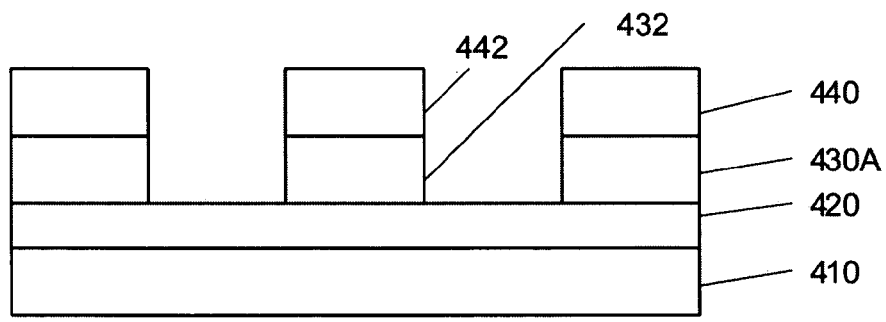

In FIG. 4B, another simplified schematic view of a partially processed semiconductor device is shown. In the illustrated embodiment, the semiconductor device has been processed using an etching process. Features 432 have been created in the TERA layer 430A by transferring the hard mask features 442 using an etch process. A substrate layer 410 is shown, and the substrate layer can comprise silicon (Si), germanium (Ge), or gallium arsenide (GaAs), or a combination of two or more thereof.

An additional layer 420 is shown on top of the substrate layer 410. The additional layer can comprise one or more layers, and each layer can comprise an oxide, a metal, or a dielectric material, or a combination of two or more thereof. In addition, a photoresist layer 440 is shown on top of the processed TERA layer 430A, and the photoresist layer 440 can comprise photoresist features 442.

Figure 4C:
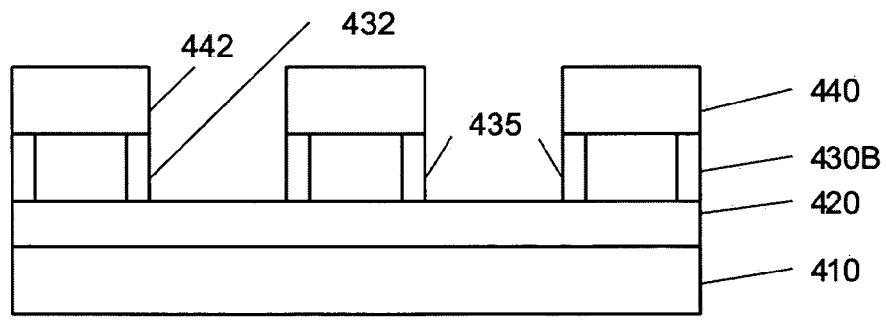

In FIG. 4C, another simplified schematic view of a partially processed semiconductor device is shown. In the illustrated embodiment, the semiconductor device has been processed using an oxidation process. Oxidized areas 435 have been created in the TERA features 432 in the TERA layer 430B by oxidizing the exposed surfaces of the TERA features 432 using an oxidation process. A substrate layer 410 is shown, and the substrate layer can comprise silicon (Si), germanium (Ge), or gallium arsenide (GaAs), or a combination of two or more thereof.

An additional layer 420 is shown on top of the substrate layer 410. The additional layer can comprise one or more layers, and each layer can comprise an oxide, a metal, or a dielectric material, or a combination of two or more thereof. A processed TERA layer 430B is shown on top of the additional layer, and the processed TERA layer 430B can comprise features 432 having oxidized areas 435. In addition, a photoresist layer 440 is shown on top of the processed TERA layer 430B, and the photoresist layer 440 can comprise photoresist features 442.

Figure 4D:
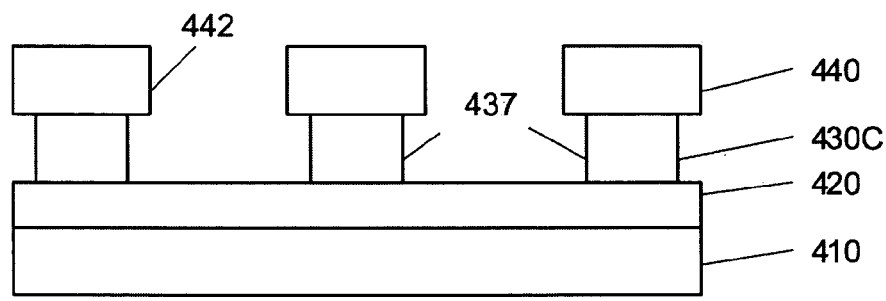

In FIG. 4D, another simplified schematic view of a partially processed semiconductor device is shown. In the illustrated embodiment, the semiconductor device has been processed using a COR process. Oxidized areas can be removed using a COR process thereby creating reduced size TERA features 437 in the TERA layer 430C. Alternately, another substantially lateral etch process can be performed in which the oxidized areas 435 can be removed creating the reduced TERA features 437 in the TERA layer 430C. A substrate layer 410 is shown, and the substrate layer can comprise silicon (Si), germanium (Ge), or gallium arsenide (GaAs), or a combination of two or more thereof.

An additional layer 420 is shown on top of the substrate layer 410. The additional layer can comprise one or more layers, and each layer can comprise an oxide, a metal, or a dielectric material, or a combination of two or more thereof. A processed (laterally etched) TERA layer 430C is shown on top of the additional layer, and the processed (laterally etched) TERA layer 430C can comprise reduced size TERA features 437. In addition, hard mask features can be shown on top of the reduced size TERA features 437.

Figure 4E:
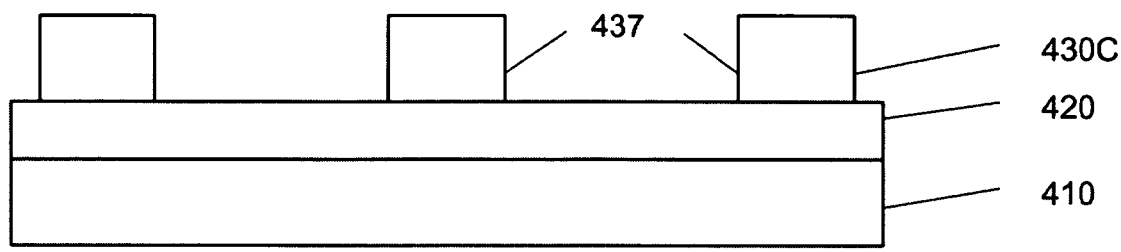

In FIG. 4E, another simplified schematic view of a partially processed semiconductor device is shown. In the illustrated embodiment, the semiconductor device has been processed using a removal process, and the hard mask features 442 have been removed. The hard mask features can be removed using an ashing process, a dry etching process, or a wet etching process, or a combination of two or more thereof. A substrate layer 410 is shown, and the substrate layer can comprise silicon (Si), germanium (Ge), or gallium arsenide (GaAs), or a combination of two or more thereof.

An additional layer 420 is shown on top of the substrate layer 410. The additional layer can comprise one or more layers, and each layer can comprise an oxide, a metal, or a dielectric material, or a combination of two or more thereof. A processed (laterally etched) TERA layer 430C is shown on top of the additional layer, and the processed (laterally etched) TERA layer 430C can comprise reduced size TERA features 437. In FIG. 4E, hard mask features have been removed from the top surfaces of the reduced size TERA features 437.

Figure 4F:
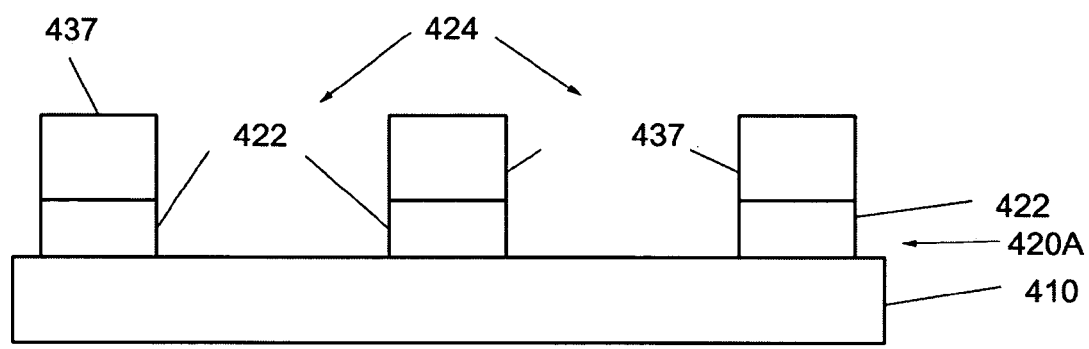

In FIG. 4F, another simplified schematic view of a partially processed semiconductor device is shown. In the illustrated embodiment, the semiconductor device has been processed using an etch process, and the additional layer 420 has been etched using the reduced size TERA features 437 as a mask. The reduced size TERA features 437 can be used as mask features and a dry etching process and/or a wet etching process can be performed. A substrate layer 410 is shown, and the substrate layer can comprise silicon (Si), germanium (Ge), or gallium arsenide (GaAs), or a combination of two or more thereof.

A processed (etched) additional layer 420A is shown on top of the substrate layer 410. The processed (etched) additional layer 420A can comprise vias 424 and additional layer features 422. The additional layer features 422 can comprise one or more layers, and each layer can comprise an oxide, a metal, or a dielectric material, or a combination of two or more thereof. A processed (laterally etched) TERA layer 430C is shown on top of the additional layer, and the processed (laterally etched) TERA layer 430C can comprise reduced size TERA features 437. For example, the additional layer features can comprise a nitride layer and a doped poly layer.

Figure 4G:
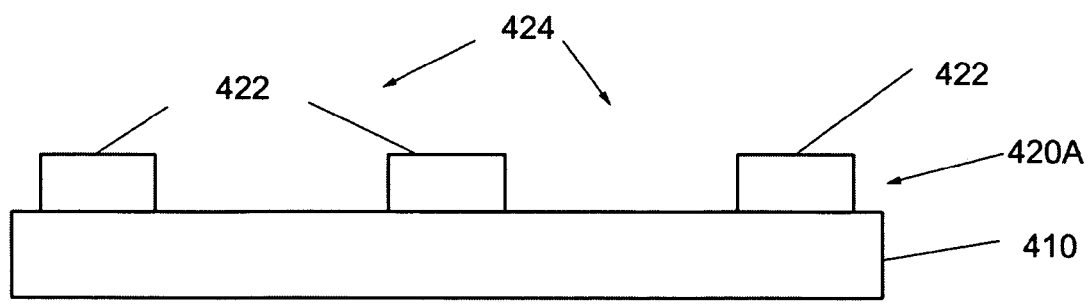

In FIG. 4G, another simplified schematic view of a partially processed semiconductor device is shown.

In the illustrated embodiment, the semiconductor device has been processed using a removal process, and the reduced size TERA features 437 have been removed. A substrate layer 410 is shown, and the substrate layer can comprise silicon (Si), germanium (Ge), or gallium arsenide (GaAs), or a combination of two or more thereof. A processed (etched) additional layer 420A is shown on top of the substrate layer 410. The processed (etched) additional layer 420A can comprise vias 424 and additional layer features 422. The additional layer features 422 can comprise one or more layers, and each layer can comprise an oxide, a metal, or a dielectric material, or a combination of two or more thereof. In this manner, reduced size features can be created in the additional layer and smaller critical dimensions (gate widths) can be achieved.

Figure 5:
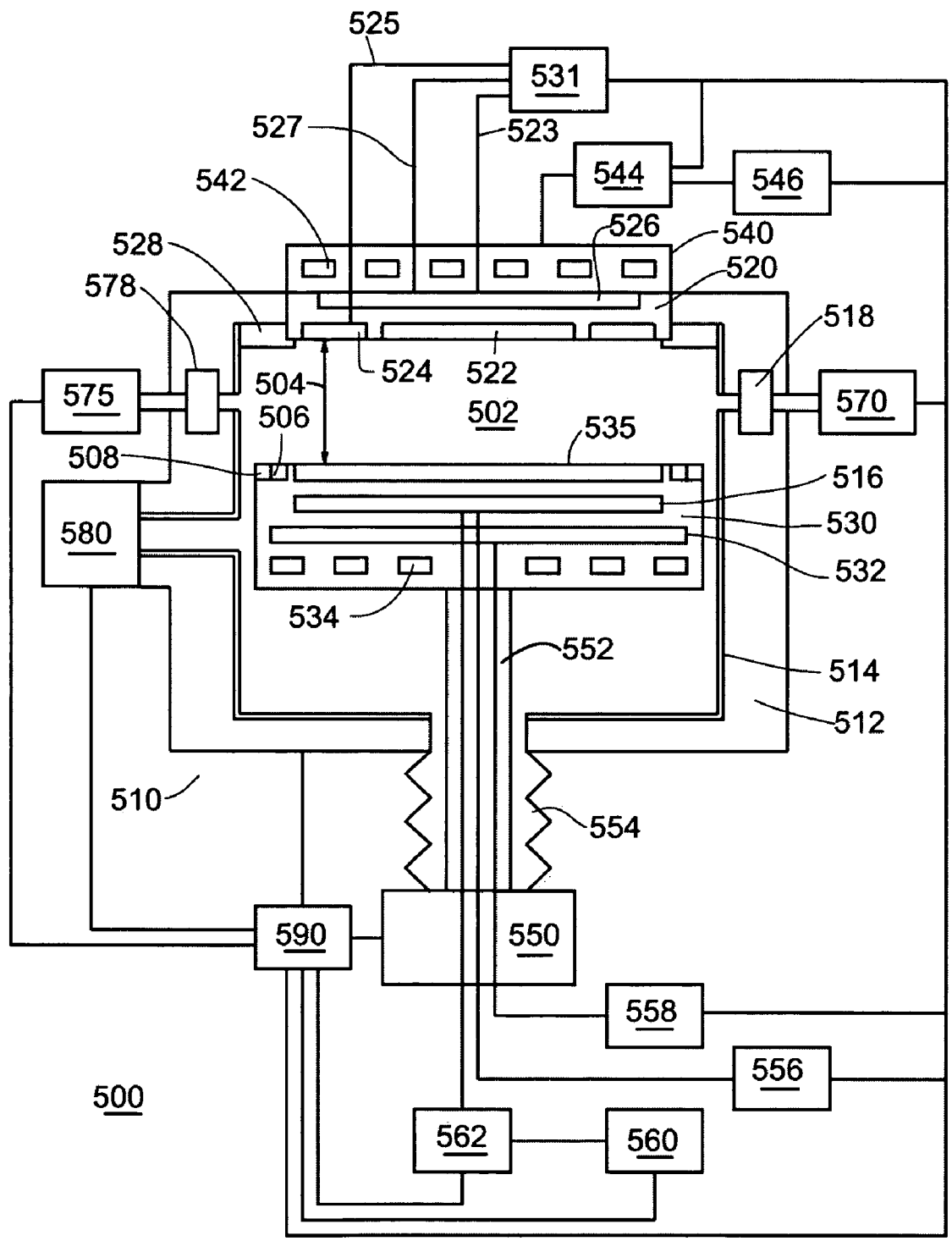
FIG. 5 illustrates a simplified block diagram of a PECVD system in accordance with an embodiment of the invention.

FIG. 5 illustrates a simplified block diagram of a PECVD system in accordance with an embodiment of the invention. In the illustrated embodiment, the PECVD system 500 comprises a processing chamber 510, an upper electrode 540 as part of a capacitively coupled plasma source, a shower plate assembly 520, a substrate holder 530 for supporting a substrate 535, a pressure control system 580, and a controller 590.

In one embodiment, the PECVD system 500 can comprise a remote plasma system 575 that can be coupled to the processing chamber 510 using a valve 578. In another embodiment, a remote plasma system and valve are not included.

In one embodiment, the PECVD system 500 can comprise the pressure control system 580 that can be coupled to the processing chamber 510. For example, the pressure control system 580 can comprise a throttle valve (not shown) and a turbomolecular pump (TMP) (not shown) and can provide a controlled pressure in processing chamber 510. In alternate embodiments, the pressure control system 580 can comprise a dry pump (not shown). For example, the chamber pressure can range from approximately 0.1 mTorr to approximately 100 mTorr. Alternatively, the chamber pressure can range from approximately 0.1 mTorr to approximately 20 mTorr.

The processing chamber 510 can facilitate the formation of plasma in the process space 502. The PECVD system 500 can be configured to process substrates of any size, such as 200 mm substrates, 300 mm substrates, or larger substrates. Alternately, the PECVD system 500 can operate by generating plasma in one or more processing chambers.

The PECVD system 500 comprises the shower plate assembly 520 coupled to the processing chamber 510. The shower plate assembly 520 is mounted opposite the substrate holder 530. The shower plate assembly 520 comprises a center region 522, an edge region 524, and a sub region 526. A shield ring 528 can be used to couple the shower plate assembly 520 to the processing chamber 510.

The center region 522 is coupled to a gas supply system 531 by a first process gas line 523. The edge region 524 is coupled to the gas supply system 531 by a second process gas line 525. The sub region 526 is coupled to the gas supply system 531 by a third process gas line 527.

The gas supply system 531 provides a first process gas to the center region 522, a second process gas to the edge region 524, and a third process gas to the sub region 526. The gas chemistries and flow rates can be individually controlled to these regions. Alternately, the center region 522 and the edge region 524 can be coupled together as a single primary region, and the gas supply system 531 can provide the first process gas and/or the second process gas to the primary region. In alternate embodiments, any of the regions can be coupled together and the gas supply system 531 can provide one or more process gasses, as appropriate.

The gas supply system 531 can comprise at least one vaporizer (not shown) for providing precursors. Alternately, a vaporizer is not required. In an alternate embodiment, a bubbling system can be used.

The PECVD system 500 comprises an upper electrode 540 that can be coupled to the shower plate assembly 520 and also to the processing chamber 510. The upper electrode 540 can comprise temperature control elements 542. The upper electrode 540 can be coupled to a first RF source 546 using a first match network 544. As would be appreciated by those skilled in the art, the first match network 544 need not be provided between the first RF source 546 and the upper electrode 540.

The first RF source 546 provides a TRF signal to the upper electrode 540, and the first RF source 546 can operate in a frequency range from approximately 0.1 MHz. to approximately 200 MHz. The TRF signal can be in the frequency range from approximately 1 MHz. to approximately 100 MHz. or alternatively in the frequency range from approximately 2 MHz. to approximately 60 MHz. The first RF source 546 can operate in a power range from approximately 0 watts to approximately 10000 watts, or alternatively the first RF source 546 can operate in a power range from approximately 0 watts to approximately 5000 watts.

The upper electrode 540 and the RF source 546 are parts of a capacitively-coupled plasma source. The capacitively-coupled plasma source may be replaced with or augmented by other types of plasma sources, such as an inductively coupled plasma (ICP) source, a transformer-coupled plasma (TCP) source, a microwave powered plasma source, an electron cyclotron resonance (ECR) plasma source, a Helicon wave plasma source, and a surface wave plasma source. As is well known in the art, the upper electrode 540 may be eliminated or reconfigured in the various suitable plasma sources.

The substrate 535 can be, for example, transferred into and out of the processing chamber 510 through a slot valve (not shown) and chamber feed-through (not shown) via a robotic substrate transfer system (not shown), and it can be received by the substrate holder 530 and mechanically translated by devices coupled thereto. Once the substrate 535 is received from the substrate transfer system, the substrate 535 can be raised and/or lowered using a translation device 550 that can be coupled to the substrate holder 530 by a coupling assembly 552.

The substrate 535 can be held or affixed to the substrate holder 530 via an electrostatic clamping system. For example, the electrostatic clamping system can comprise an electrode 516 and an ESC supply 556. Clamping voltages that can range from approximately −2000 V to approximately +2000 V, for example, can be provided to the clamping electrode 516. Alternatively, the clamping voltage can range from approximately −1000 V to approximately +1000 V. In alternate embodiments, the ESC system and the ESC supply 556 are not required.

The substrate holder 530 can comprise lift pins (not shown) for lowering and/or raising the substrate 535 to and/or from the surface of the substrate holder 530. In alternate embodiments, different lifting devices can be provided in the substrate holder 530, as would be appreciated by those skilled in the art. In alternate embodiments, gas can, for example, be delivered to the backside of the substrate 535 via a backside gas system to improve the gas-gap thermal conductance between the substrate 535 and the substrate holder 530.

A temperature control system can also be provided. Such a system can be utilized when temperature control of the substrate 535 is required at elevated or reduced temperatures. For example, a heating element 532, such as resistive heating elements, or thermo-electric heaters/coolers can be included, and the substrate holder 530 can further include a heat exchange system 534. The heating element 532 can be coupled to a heater supply 558. The heat exchange system 534 can include re-circulating coolant flow passages that receive heat from the substrate holder 530 and transfer the heat to a heat exchanger system (not shown), or when heating, transfers the heat from the heat exchanger system to the substrate holder 530.

Also, the electrode 516 can be coupled to a second RF source 560 using a second match network 562. Alternately, the second match network 562 is not required.

The second RF source 560 provides a bottom RF signal (BRF) to the lower electrode 516, and the second RF source 560 can operate in a frequency range from approximately 0.1 MHz. to approximately 200 MHz. The BRF signal can be in the frequency range from approximately 0.2 MHz. to approximately 30 MHz. or alternatively, in the frequency range from approximately 0.3 MHz. to approximately 15 MHz. The second RF source 560 can operate in a power range from approximately 0.0 watts to approximately 1000 watts, or alternatively, the second RF source 560 can operate in a power range from approximately 0.0 watts to approximately 500 watts. In various embodiments, the lower electrode 516 may not be used, or may be the sole source of plasma within the chamber 510, or may augment any additional plasma source.

The PECVD system 500 can further comprise the translation device 550 that can be coupled by a bellows 554 to the processing chamber 510. Also, coupling assembly 552 can couple the translation device 550 to the substrate holder 530. The bellows 554 are configured to seal the vertical translation device 550 from the atmosphere outside the processing chamber 510.

The translation device 550 allows a variable gap 504 to be established between the shower plate assembly 520 and the substrate 535. The gap 504 can range from approximately 10 mm to approximately 200 mm, and alternatively, the gap 504 can range from approximately 20 mm to approximately 80 mm. The gap 504 can remain fixed or the gap 504 can be changed during a deposition process.

Additionally, the substrate holder 530 can further comprise a focus ring 506 and a ceramic cover 508. Alternately, the focus ring 506 and/or the ceramic cover 508 need not be included, as would be appreciated by those skilled in the art.

At least one chamber wall 512 can comprise a coating 514 to protect the wall. For example, the coating 514 can comprise a ceramic material. In an alternate embodiment, the coating 514 is not required. Furthermore, a ceramic shield (not shown) can be used within the processing chamber 510.

In addition, the temperature control system can be used to control the chamber wall 512 temperature. For example, ports can be provided in the chamber wall 512 for controlling temperature. The chamber wall 512 temperature can be maintained relatively constant while a process is being performed in the chamber 510.

Also, the temperature control system can be used to control the temperature of the upper electrode 540. The temperature control elements 542 can be used to control the upper electrode 540 temperature. The upper electrode 540 temperature can be maintained relatively constant while a process is being performed in the chamber 510.

In addition, the PECVD system 500 can also comprise the remote plasma system 575 that can be used for chamber 510 cleaning.

Furthermore, the PECVD system 500 can also comprise a purging system (not shown) that can be used for controlling contamination and/or chamber 510 cleaning.

In an alternate embodiment, the processing chamber 510 can, for example, further comprise a monitoring port (not shown). The monitoring port can, for example, permit optical monitoring of the process space 502.

The PECVD system 500 also comprises the controller 590. The controller 590 can be coupled to the chamber 510, the shower plate assembly 520, the substrate holder 530, the gas supply system 531, the upper electrode 540, the first RF match 544, the first RF source 546, the translation device 550, the ESC supply 556, the heater supply 558, the second RF match 562, the second RF source 560, the purging system 595, the remote plasma device 575, and the pressure control system 580. The controller 590 can be configured to provide control data to these components and receive data such as process data from these components. For example, the controller 590 can comprise a microprocessor, a memory, and a digital I/O port capable of generating control voltages sufficient to communicate and activate inputs to the processing system 500 as well as monitor outputs from the PECVD system 500.

Moreover, the controller 590 can exchange information with system components. Also, a program stored in the memory can be utilized to control the aforementioned components of the PECVD system 500 according to a process recipe. In addition, controller 590 can be configured to analyze the process data, to compare the process data with target process data, and to use the comparison to change a process and/or control the deposition tool. Also, the controller 590 can be configured to analyze the process data, to compare the process data with historical process data, and to use the comparison to predict, prevent, and/or declare a fault.

During the deposition of a TERA layer, the substrate 535 can be placed on the translatable substrate holder 530. For example, the translatable substrate holder 530 can be used to establish the gap between the upper electrode 540 surface and the surface of the translatable substrate holder 530. The gap 504 can range from approximately 10 mm to approximately 200 mm, or alternatively, the gap 504 can range from approximately 20 mm to approximately 80 mm. In alternate embodiments, the gap 504 size can be changed.

During a TERA layer deposition process, a TRF signal can be provided to the upper electrode 540 using the first RF source 544. For example, the first RF source 544 can operate in a frequency range from approximately 0.1 MHz. to approximately 200 MHz. Alternatively, the first RF source 544 can operate in a frequency range from approximately 1 MHz. to approximately 100 MHz., or the first RF source 544 can operate in a frequency range from approximately 2 MHz. to approximately 60 MHz. The first RF source 544 can operate in a power range from approximately 10 watts to approximately 10000 watts, or alternatively, the first RF source 544 can operate in a power range from approximately 10 watts to approximately 5000 watts Also, during a TERA layer deposition process, a BRF signal can be provided to the lower electrode 530 using the second RF source 560. For example, the second RF source 560 can operate in a frequency range from approximately 0.1 MHz. to approximately 200 MHz. Alternatively, the second RF source 560 can operate in a frequency range from approximately 0.2 MHz. to approximately 30 MHz. or the second RF source can operate in a frequency range from approximately 0.3 MHz. to approximately 15 MHz. The second RF source 560 can operate in a power range from approximately 0.0 watts to approximately 1000 watts, or alternatively, the second RF source 560 can operate in a power range from approximately 0.0 watts to approximately 500 watts. In an alternate embodiment, a BRF signal is not required.

In addition, a process gas can be provided to the processing chamber 510 using the shower plate assembly 520. For example, process gas can comprise a silicon-containing precursor, a carbon-containing precursor, or oxygen containing gas, or a combination of two or more thereof. An inert gas can also be included. For example, the flow rate for the silicon-containing precursor and the carbon-containing precursor can range from approximately 0 sccm to approximately 5000 sccm and the flow rate for the inert gas can range from approximately 0 sccm to approximately 10000 sccm. The silicon-containing precursor can comprise monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), dimethyidimethoxysilane (DMDMOS), or tetramethylcyclotetrasilane (TMCTS), or a combination of two or more thereof. The carbon-containing precursor can comprise $CH_4$, $C_2H_4$, $C_2H_2$, $C_6H_6$, or $C_6H_5OH$, or a combination of two or more thereof. The inert gas can comprise argon, helium, or nitrogen, or a combination of two or more thereof. For example, the oxygen containing gas can comprise at $O_2$, CO, NO, $N_2O$, or $CO_2$, or a combination of two or more thereof, and the flow rate can range from approximately 0 sccm to approximately 10000 sccm.

The TERA layer can comprise a material having a refractive index (n) ranging from approximately 1.5 to approximately 2.5 when measured at a wavelength of at least one of 248 nm, 193 nm, or 157 nm, and an extinction coefficient (k) ranging from approximately 0.10 to approximately 0.9 when measured at a wavelength of at least one of 248 nm, 193 nm, or 157 nm. For example, a TERA layer can comprise a SiCOH material, or a SiCH material, or a combination thereof. The TERA layer can comprise a thickness ranging from approximately 30 nm to approximately 500 nm, and the deposition rate can range from approximately 100 Å/min to approximately 10000 Å/min. The TERA layer can comprise one or more layers having different etch-resistance and/or optical properties.

Furthermore, the chamber pressure and substrate temperature can be controlled during the deposition of the TERA layer. For example, the chamber pressure can range from approximately 0.1 mTorr to approximately 100.0 mTorr, and the substrate temperature can range from approximately 0° C. to approximately 500° C.

Figure 6:
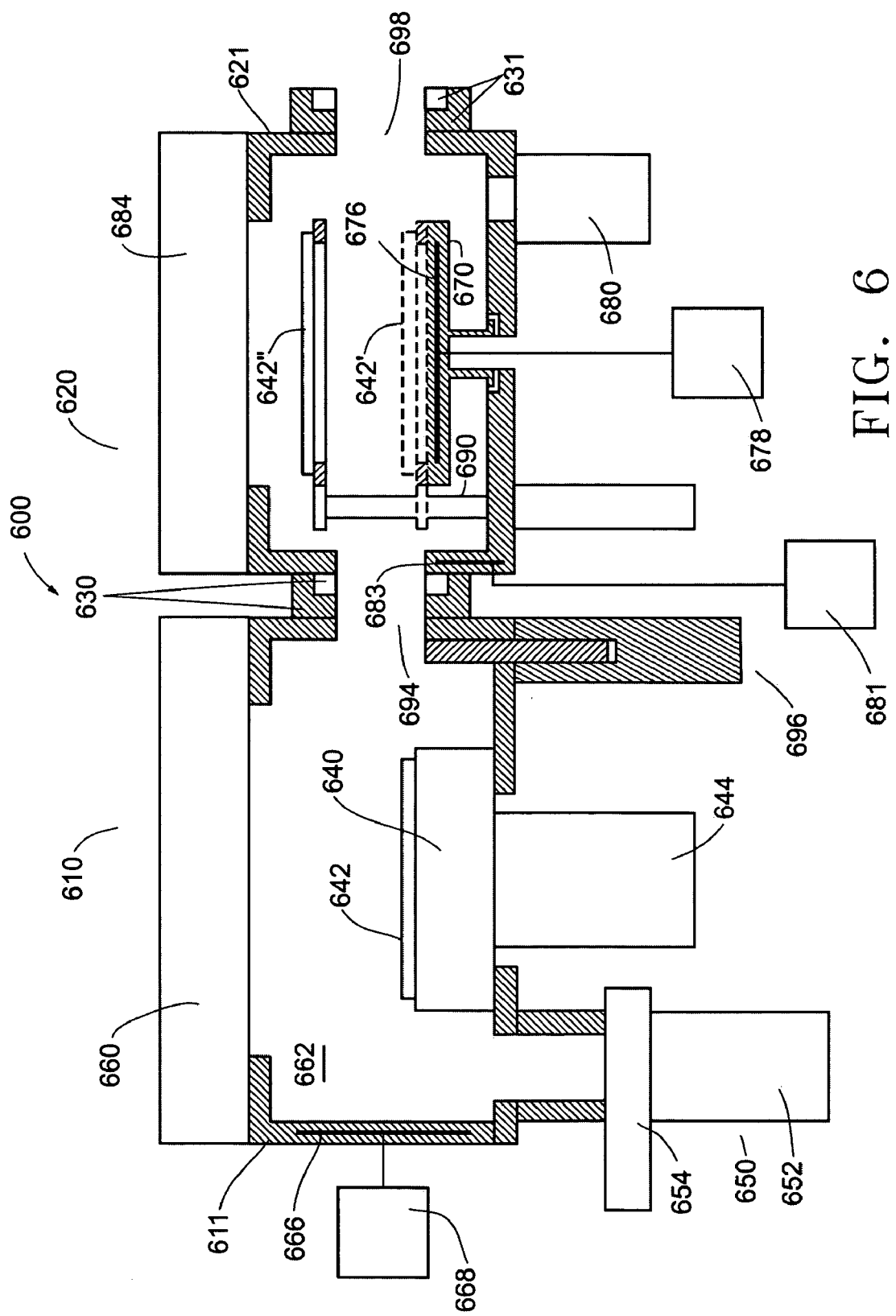
FIG. 6 illustrates a simplified block diagram for a treatment system in accordance with an embodiment of the invention.

FIG. 6 illustrates a simplified block diagram for a processing system 600 in accordance with an embodiment of the invention. In the illustrated embodiment, the processing system 600 for performing a chemical treatment and a thermal treatment of a substrate 642 is presented. The processing system 600 comprises a chemical treatment system 610, and a thermal treatment system 620 coupled to the chemical treatment system 610. The chemical treatment system 610 comprises a chemical treatment chamber 611, which can be temperature-controlled. The thermal treatment system 620 comprises a thermal treatment chamber 621, which can be temperature-controlled. The chemical treatment chamber 611 and the thermal treatment chamber 621 can be thermally insulated from one another using a thermal insulation assembly 630, and vacuum isolated from one another using a gate valve assembly 696.

As illustrated in FIG. 6, the chemical treatment system 610 further comprises a temperature controlled substrate holder 640 configured to be substantially thermally isolated from the chemical treatment chamber 611 and configured to support the substrate 642. A vacuum pumping system 650 is coupled to the chemical treatment chamber 611 to evacuate the chemical treatment chamber 611. A gas distribution system 660 is also connected to the chemical treatment chamber 611 for introducing a process gas into a process space 662 within the chemical treatment chamber 611.

Also, the thermal treatment system 620 further comprises a temperature controlled substrate holder 670 mounted within the thermal treatment chamber 621. The substrate holder 670 is configured to be substantially thermally insulated from the thermal treatment chamber 621 and is configured to support a substrate 642'. A vacuum pumping system 680 is used to evacuate the thermal treatment chamber 621. A substrate lifter assembly 690 is coupled to the thermal treatment chamber 621. The lifter assembly 690 can vertically translate the substrate 642'' between a holding plane (solid lines) and the substrate holder 670 (dashed lines), or a transfer plane located therebetween. The thermal treatment chamber 621 can further comprise an upper assembly 684.

Additionally, the chemical treatment chamber 611, thermal treatment chamber 621, and thermal insulation assembly 630 define a common opening 694 through which a substrate 642 can be transferred. During processing, the common opening 694 can be sealed closed using the gate valve assembly 696 in order to permit independent processing in the two chambers 611, 621. Furthermore, a transfer opening 698 can be formed in the thermal treatment chamber 621 in order to permit substrate exchanges with a transfer system as illustrated in FIG. 1. For example, a second thermal insulation assembly 631 can be implemented to thermally insulate the thermal treatment chamber 621 from a transfer system (not shown). Although the opening 698 is illustrated as part of the thermal treatment chamber 621, the transfer opening 698 can be formed in the chemical treatment chamber 611 and not the thermal treatment chamber 621, or the transfer opening 698 can be formed in both the chemical treatment chamber 611 and the thermal treatment chamber 621.

As illustrated in FIG. 6, the chemical treatment system 610 comprises the substrate holder 640 and the substrate holder assembly 644 in order to provide several operational functions for thermally controlling and processing the substrate 642. The substrate holder 640 and the substrate holder assembly 644 can comprise an electrostatic clamping system (or mechanical clamping system) in order to electrically (or mechanically) clamp the substrate 642 to the substrate holder 640. Furthermore, the substrate holder 640 can, for example, further include a cooling system having a re-circulating coolant flow that receives heat from the substrate holder 640 and transfers heat to a heat exchanger system (not shown), or when heating, transfers heat from the heat exchanger system.

Moreover, a heat transfer gas can, for example, be delivered to the back-side of the substrate 642 via a backside gas system to improve the gas-gap thermal conductance between the substrate 642 and the substrate holder 640. For instance, the heat transfer gas supplied to the back-side of the substrate 642 can comprise an inert gas such as helium, argon, xenon, krypton, a process gas, or other gas such as oxygen, nitrogen, or hydrogen. Such a system can be utilized when temperature control of the substrate 642 is required at elevated or reduced temperatures. For example, the backside gas system can comprise a multi-zone gas distribution system such as a two-zone (center-edge) system, wherein the back-side gas gap pressure can be independently varied between the center and the edge of the substrate 642. In other embodiments, heating/cooling elements, such as resistive heating elements, or thermoelectric heaters/coolers can be included in the substrate holder 640, as well as the chamber wall of the chemical treatment chamber 611.

Also, the substrate holder 640 can further comprise a lift pin assembly (not shown) capable of raising and lowering three or more lift pins (not shown) in order to vertically translate the substrate 642 to and from an upper surface of the substrate holder 640 and a transfer plane in the processing system 600.

In addition, the temperature of the temperature-controlled substrate holder 640 can be monitored using a temperature sensing device (not shown) such as a thermocouple (e.g. a K-type thermocouple, Pt sensor, etc.). Furthermore, a controller can utilize the temperature measurement as feedback to the substrate holder 640 assembly in order to control the temperature of substrate holder 640. For example, a fluid flow rate, fluid temperature, heat transfer gas type, heat transfer gas pressure, clamping force, resistive heater element current or voltage, thermoelectric device current or polarity, or a combination of two or more thereof can be adjusted in order to affect a change in the temperature of substrate holder 640 and/or the temperature of the substrate 642.

Referring again to FIG. 6, chemical treatment system 610 comprises a gas distribution system 660. In one embodiment, a gas distribution system 660 can comprise a showerhead gas injection system (not shown). The gas distribution system 660 can further comprise one or more gas distribution orifices to distribute a process gas to the process space 662 within the chemical treatment chamber 611. Additionally, the process gas can, for example, comprise $NH_3$, HF, $H_2$, $O_2$, CO, $CO_2$, Ar, He, etc.

As shown in FIG. 6, the chemical treatment system 620 further comprises the temperature controlled chemical treatment chamber 611 that is maintained at an elevated temperature. For example, a wall heating element 666 can be coupled to a wall temperature control unit 668, and the wall heating element 666 can be configured to couple to the chemical treatment chamber 611. The heating element 666 can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAI) and the Nikrothal family includes austenitic alloys (NiCr, NiCrFe).

When an electrical current flows through the filament, power is dissipated as heat, and, therefore, the wall temperature control unit 668 can, for example, comprise a controllable DC power supply. For example, wall heating element 666 can comprise at least one Firerod cartridge heater commercially available from Watlow (1310 Kingsland Dr., Batavia, Ill., 60510). A cooling element can also be employed in the chemical treatment chamber 611. The temperature of the chemical treatment chamber 611 can be monitored using a temperature-sensing device such as a thermocouple (e.g. a K-type thermocouple, Pt sensor, etc.). Furthermore, a controller can utilize the temperature measurement as feedback to the wall temperature control unit 668 in order to control the temperature of the chemical treatment chamber 611.

Referring again to FIG. 6, the chemical treatment system 610 can further comprise a temperature controlled gas distribution system 660 that can be maintained at any selected temperature.

Furthermore, in FIG. 6, the vacuum pumping system 650 is shown that can comprise a vacuum pump 652 and a gate valve 654 for throttling the chamber pressure. The vacuum pump 652 can, for example, include a turbo-molecular vacuum pump (TMP) capable of a pumping speed up to 5000 liters per second (and greater). For example, the TMP can be a Seiko STP-A803 vacuum pump, or an Ebara ET1301W vacuum pump. TMPs are useful for low pressure processing, typically less than 50 mTorr. For high pressure (i.e., greater than 100 mTorr) or low throughput processing (i.e., no gas flow), a mechanical booster pump and dry roughing pump can be used.

In one embodiment, the processing system 600 can be controlled using a controller, such as controller 90 in FIG. 1.

In an alternate embodiment, the processing system 600 can comprise a controller (not shown) that can be coupled to the chemical treatment system 610 and the thermal treatment system 620. For example, the controller can comprise a processor, memory, and a digital I/O port capable of exchanging information with the chemical treatment system 610 as well as the thermal treatment system 620.

As shown in FIG. 6, the thermal treatment system 620 further comprises a temperature controlled substrate holder 670. The substrate holder 670 can further comprise a heating element 676 embedded therein and a substrate holder temperature control unit 678 coupled thereto. The heating element 676 can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, and Akrothal, which are registered trademark names for metal alloys produced by Kanthal Corporation of Bethel, Conn. The Kanthal family includes ferritic alloys (FeCrAl) and the Nikrothal family includes austenitic alloys (NiCr, NiCrFe).

As discussed above, when an electrical current flows through the filament, power is dissipated as heat, and, therefore, the substrate holder temperature control unit 678 can, for example, comprise a controllable DC power supply. Alternately, the temperature controlled substrate holder 670 can, for example, be a cast-in heater commercially available from Watlow (1310 Kingsland Dr., Batavia, Ill., 60510) capable of a maximum operating temperature of 400 to 450 C, or a film heater comprising aluminum nitride materials that is also commercially available from Watlow and capable of operating temperatures as high as 300 C and power densities of up to 23.25 $W/cm^2$. Alternatively, a cooling element can be incorporated in the substrate holder 670.

The temperature of the substrate holder 670 can be monitored using a temperature-sensing device such as a thermocouple (e.g. a K-type thermocouple). Furthermore, a controller can utilize the temperature measurement as feedback to the substrate holder temperature control unit 678 in order to control the temperature of the substrate holder 670.

Referring again to FIG. 6, the thermal treatment system 620 can further comprise a temperature controlled thermal treatment chamber 621 that is maintained at a selected temperature. For example, a thermal wall heating element 683 can be coupled to a thermal wall temperature control unit 681, and the thermal wall heating element 683 can be configured to couple to the thermal treatment chamber 621. The heating element 683 can, for example, comprise a resistive heater element such as a tungsten, nickel-chromium alloy, aluminum-iron alloy, aluminum nitride, etc., filament. Examples of commercially available materials to fabricate resistive heating elements include Kanthal, Nikrothal, Akrothal, which are registered trademark names for metal alloys produced by Kanthal Corporation of Bethel, Conn. The Kanthal family includes ferritic alloys (FeCrAI) and the Nikrothal family includes austenitic alloys (NiCr, NiCrFe).

When an electrical current flows through the filament, power is dissipated as heat, and, therefore, the thermal wall temperature control unit 681 can, for example, comprise a controllable DC power supply. For example, thermal wall heating element 683 can comprise at least one Firerod cartridge heater commercially available from Watlow (1310 Kingsland Dr., Batavia, Ill., 60510). Alternatively, or in addition, cooling elements may be employed in thermal treatment chamber 621. The temperature of the thermal treatment chamber 621 can be monitored using a temperature-sensing device such as a thermocouple (e.g. a K-type thermocouple, Pt sensor, etc.). Furthermore, a controller can utilize the temperature measurement as feedback to the thermal wall temperature control unit 681 in order to control the temperature of the thermal treatment chamber 621.

In addition, thermal treatment system 620 can further comprise an upper assembly 684. The upper assembly 684 can, for example, comprise a gas injection system for introducing a purge gas, process gas, or cleaning gas to the thermal treatment chamber 621. Alternately, the thermal treatment chamber 621 can comprise a gas injection system separate from the upper assembly. For example, a purge gas, process gas, or cleaning gas can be introduced to the thermal treatment chamber 621 through a side-wall thereof.

In an alternate embodiment, the upper assembly 684 can comprise a radiant heater such as an array of tungsten halogen lamps for heating the substrate 642" positioned on the substrate lifter assembly 690. The thermal treatment system 620 can further comprise a temperature controlled upper assembly 684 that can be maintained at a selected temperature. For example, the upper assembly 684 can comprise a heating element. The temperature of the upper assembly 684 can be monitored using a temperature-sensing device. Furthermore, a controller can utilize the temperature measurement as feedback to control the temperature of the upper assembly 684. The upper assembly 684 may additionally or alternatively include a cooling element.

Referring again to FIG. 6, the thermal treatment system 620 can further comprise a substrate lifter assembly 690. The substrate lifter assembly 690 can be configured to lower a substrate 642' to an upper surface of the substrate holder 670, as well as raise a substrate 642" from an upper surface of the substrate holder 670 to a holding plane, or a transfer plane therebetween. At the transfer plane, the substrate 642" can be exchanged with a transfer system utilized to transfer substrates into and out of the chemical and thermal treatment chambers 611, 621. At the holding plane, the substrate 642" can be cooled while another substrate is exchanged between the transfer system and the chemical and thermal treatment chambers 611, 621.

The thermal treatment system 620 further comprises a vacuum pumping system 680. The vacuum pumping system 680 can, for example, comprise a vacuum pump, and a throttle valve such as a gate valve or butterfly valve. The vacuum pump can, for example, include a turbo-molecular vacuum pump (TMP) capable of a pumping speed up to 5000 liters per second (and greater). TMPs are useful for low pressure processing, typically less than 50 mTorr. For high pressure processing (i.e., greater than 100 mTorr), a mechanical booster pump and dry roughing pump can be used.

In addition, a gate valve assembly 696 can be utilized to vertically translate a gate valve in order to open and close the common opening 694. The gate valve assembly 696 can vacuum seal the common opening 694.

In one embodiment, the processing system 600 can comprise a chemical oxide removal (COR) system 610 for trimming oxidized features of a TERA layer. The processing system 600 comprises the chemical treatment system 610 for chemically treating exposed surfaces of features on a TERA layer, such as oxidized surfaces, whereby adsorption of the process chemistry on the exposed surfaces of the features on a TERA layer affects chemical alteration of the exposed surfaces. Additionally, the processing system 600 comprises the thermal treatment system 620 for thermally treating the substrate, whereby the substrate temperature is elevated in order to desorb (or evaporate) the chemically altered exposed surfaces of the features on a TERA layer.

An exemplary COR process can comprise a number of process steps. For example, the substrate 642 can be transferred into the chemical treatment system 610 using the substrate transfer system. The substrate 642 can be received by lift pins that are housed within the substrate holder 640, and the substrate 642 is lowered to the substrate holder 640. Thereafter, the substrate 642 can be secured to the substrate holder 660 using a clamping system, such as an electrostatic clamping system, and a heat transfer gas can be supplied to the backside of the substrate 642.

Next, one or more chemical processing parameters for chemical treatment of the substrate 642 can be established. For example, the one or more chemical processing parameters comprise a chemical treatment processing pressure, a chemical treatment wall temperature, a chemical treatment substrate holder temperature, a chemical treatment substrate temperature, a chemical treatment gas distribution system temperature, or a chemical treatment gas flow rate, or a combination of two or more thereof. Then, the substrate 642 can be chemically treated for a first period of time. The first period of time can range from 10 to 480 seconds, for example.

Next, the substrate 642 can be transferred from the chemical treatment chamber 611 to the thermal treatment chamber 621. During which time, the substrate clamp can be removed, and the flow of heat transfer gas to the backside of the substrate 642 can be terminated. The substrate 642 can be vertically lifted from the substrate holder 640 to the transfer plane using the lift pin assembly housed within the substrate holder 640. The transfer system can receive the substrate 642 from the lift pins and can position the substrate 642 within the thermal treatment system 620. Therein, the substrate lifter assembly 690 receives the substrate 641', 642" from the transfer system, and lowers the substrate 642' to the substrate holder 670

Then, the thermal processing parameters for a thermal treatment of the substrate 642' can be set. For example, the one or more thermal processing parameters comprise a thermal treatment wall temperature, a thermal treatment upper assembly temperature, a thermal treatment substrate temperature, a thermal treatment substrate holder temperature, a thermal treatment substrate temperature, or a thermal treatment processing pressure, or a combination of two or more thereof. Next, the substrate 642' can be thermally treated for a second period of time. The second period of time can range from 10 to 480 seconds, for example.

Figure 7:
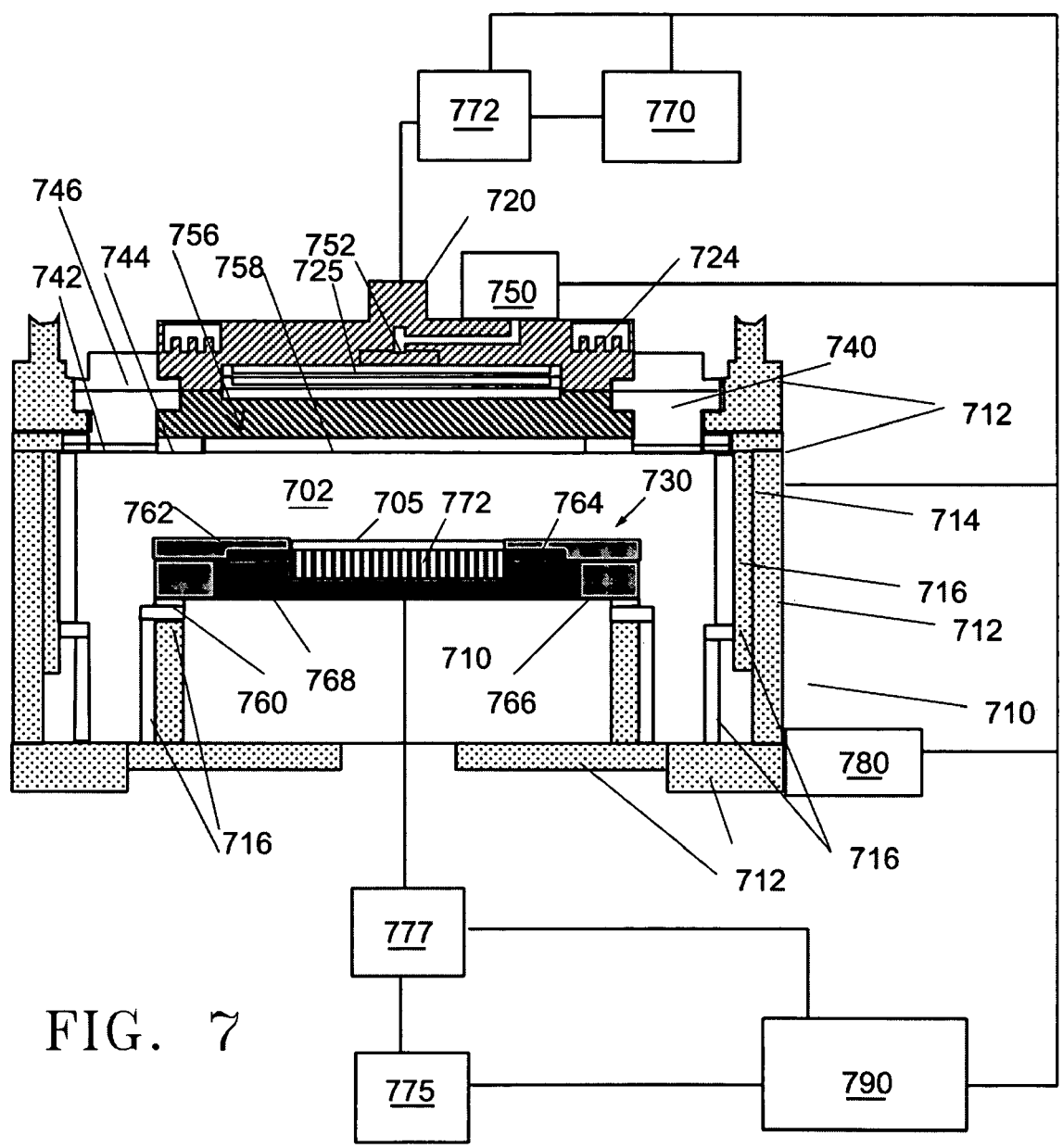
FIG. 7 illustrates a simplified block diagram of a processing subsystem in accordance with an embodiment of the invention.

FIG. 7 illustrates a simplified block diagram of a processing subsystem 700 in accordance with an embodiment of the invention. In the illustrated embodiment, the processing subsystem 700 for performing a number of processes, such as etching, ashing, cleaning, and oxidizing, is presented. In the illustrated embodiment, the processing subsystem 700 can comprise a processing chamber 710, an upper assembly 720, a gas supply system 750, a shower plate assembly 756, a substrate holder 730 for supporting a substrate 705, a pressure control system 780, and a controller 790.

In one embodiment, the processing subsystem 700 can comprise the pressure control system 780 that can be coupled to the processing chamber 710. For example, the pressure control system 780 can comprise a throttle valve (not shown) and a turbomolecular pump (TMP) (not shown) and can provide a controlled pressure in the processing chamber 710. In alternate embodiments, the pressure control system 700 can comprise a dry pump. For example, the chamber pressure can range from approximately 0.1 mTorr to approximately 100 mTorr. Alternatively, the chamber pressure can range from approximately 0.1 mTorr to approximately 20 mTorr.

The processing chamber 710 can facilitate the formation of plasma in a process space 702. The processing subsystem 700 can be configured to process substrates of any size, such as 200 mm substrates, 300 mm substrates, or larger substrates. Alternately, the processing subsystem 700 can operate by generating plasma in one or more processing chambers.

The processing subsystem 700 can comprise a shower plate 758 coupled to gas distribution system components 756 and 752. For example, the gas distribution system component 752 can be coupled to a gas distribution system 750. the shower plate 758 can comprise quartz and can be mounted opposite the substrate holder 730. the shower plate 758 can comprise one or more distribution regions (not shown). A shield ring 744 can be used to couple the shower plate 758 to the gas distribution system component 756. Ceramic insulators 740, 742, and 746 can be used to couple the gas distribution system component 756 and the shower plate 758 to the processing chamber 710.

The gas distribution system 750 can provide process gas to the gas distribution system components 756, 752 and to the shower plate 758. The gas chemistries and flow rates can be individually controlled.

The processing subsystem 700 can comprise an upper electrode 725 that can be coupled to the gas distribution system components 756, 752, to the shower plate 758 and to the processing chamber 710. The upper electrode 725 can comprise temperature control elements (not shown). The upper electrode 725 can be coupled to a first RF source 770 using a first match network 772. Alternatively, a separate match network 772 is not required.

The first RF source 770 can provide a TRF signal to the upper electrode, and the first RF source 770 can operate in a frequency range from approximately 0.1 MHz. to approximately 200 MHz. The TRF signal can be in the frequency range from approximately 1 MHz. to approximately 100 MHz. or alternatively in the frequency range from approximately 10 MHz. to approximately 100 MHz. The first RF source 790 can operate in a power range from approximately 0 watts to approximately 10000 watts, or alternatively the first RF source 770 can operate in a power range from approximately 0 watts to approximately 5000 watts.

The upper electrode 725 and the first RF source 770 can be parts of a capacitively coupled plasma source. The capacitively couple plasma source may be replaced with or augmented by other types of plasma sources, such as an inductively coupled plasma (ICP) source, a transformer-coupled plasma (TCP) source, a microwave powered plasma source, an electron cyclotron resonance (ECR) plasma source, a Helicon wave plasma source, and a surface wave plasma source. As is well known in the art, the upper electrode 725 may be eliminated or reconfigured in the various suitable plasma sources.

The substrate 705 can be, for example, transferred into and out of processing chamber 710 through a slot valve (not shown) and chamber feed-through (not shown) via robotic substrate transfer system (not shown), and it can be received by the substrate holder 730. In an alternate embodiment, the processing chamber 710 can comprise a translation device (not shown), and when the substrate 705 is received from the substrate transfer system, the substrate 705 can be raised and/or lowered using a translation device (not shown) that can be coupled to the substrate holder 730.

The substrate 705 can be affixed to the substrate holder 730 via an electrostatic clamping system 764. For example, the electrostatic clamping system 764 can comprise an electrode and an ESC supply. Clamping voltages that can range from approximately −5000 V to approximately +5000 V, for example, can be provided to the clamping electrode. Alternatively, the clamping voltage can range from approximately −2500 V to approximately +2500 V. In alternate embodiments, an ESC system and supply may be omitted altogether.

The substrate holder 730 can comprise lift pins (not shown) for lowering and/or raising the substrate 705 to and/or from the surface of the substrate holder 730. In alternate embodiments, different lifting means can be provided in the substrate holder 730. In alternate embodiments, gas can, for example, be delivered to the backside of the substrate 705 via a backside gas system to improve the gas-gap thermal conductance between the substrate 705 and the substrate holder 730.

A temperature control system can also be provided. Such a system can be utilized when temperature control of the substrate is required at elevated or reduced temperatures. For example, temperature control elements (not shown) can be included in the substrate holder 730, the processing chamber 710 and/or the upper assembly 720.

Also, an electrode 768 can be coupled to a second RF source 775 using a second match network 777. Alternately, the match network 777 may be omitted altogether.

The second RF source 775 can provide a bottom RF signal (BRF) to the lower electrode 768, and the second RF source 775 can operate in a frequency range from approximately 0.1 MHz. to approximately 200 MHz. The BRF signal can be in the frequency range from approximately 0.2 MHz. to approximately 30 MHz. or alternatively, in the frequency range from approximately 0.3 MHz. to approximately 15 MHz. The second RF source 775 can operate in a power range from approximately 0.0 watts to approximately 2500 watts, or alternatively, the second RF source 775 can operate in a power range from approximately 0.0 watts to approximately 500 watts. In various embodiments, the lower electrode 768 may be not used, or may be the sole source of plasma within the chamber, or may augment any additional plasma source.

Additionally, the substrate holder 730 can further comprise a quartz focus ring 762 and quartz isolators 760, 766. Alternately, the focus ring 762 and/or quartz isolators 760, 766 may be omitted altogether.

The processing chamber 710 can further comprise a chamber liner 714 and at least one protective element 716. For example, the protective element 716 can comprise a ceramic material, and can be used to protect the substrate holder 730 and the wall. In an alternate embodiment, the protective element 716 may be omitted altogether.

In one embodiment, a gap can be established between the shower plate 758 and the substrate holder 730 using different wall heights for the processing chamber 710. For example, a 170 mm gap can be established. In alternate embodiments, different gap sizes can be used. In other embodiments, a translation device (not shown) can be used to provide a variable gap, and the gap can remain fixed or the gap can be changed during a process.

In an alternate embodiment, the processing chamber 710 can, for example, further comprise a monitoring port (not shown). A monitoring port can, for example, permit optical monitoring of the process space 702.

The processing subsystem 700 can also comprise the controller 790. The controller 790 can be coupled to the processing chamber 710, the gas supply system 750, the first RF match 772, the first RF source 770, the second RF match 787, the second RF source 785, and the pressure control system 780. The controller 790 can be configured to provide control data to these components and receive data such as process data from these components. For example, controller 790 can comprise a microprocessor, a memory, and a digital I/O port capable of generating control voltages sufficient to communicate and activate inputs to the processing system 700 as well as monitor outputs from the processing subsystem 700.

Moreover, the controller 790 can exchange information with system components. Also, a program stored in the memory can be utilized to control the aforementioned components of the processing subsystem 700 according to a process recipe. In addition, controller 790 can be configured to analyze the process data, to compare the process data with target process data, and to use the comparison to change a process and/or control the deposition tool. Also, the controller 790 can be configured to analyze the process data, to compare the process data with historical process data, and to use the comparison to predict, prevent, and/or declare a fault. During the etching of a TERA layer, the substrate 705 can be placed on the substrate holder 730 in the processing chamber 710. For example, the processing chamber 710 can be chosen based on the gap size between the upper electrode surface 725 and a surface of the substrate holder 730. The gap can range from approximately 10 mm to approximately 200 mm, or alternatively, the gap can range from approximately 150 mm to approximately 190 mm. In alternate embodiments, the gap size can be different.

During a TERA layer etching process, a TRF signal can be provided to the upper electrode 725 using the first RF source 770. For example, the first RF source 770 can operate in a frequency range from approximately 0.1 MHz. to approximately 200 MHz. Alternatively, the first RF source 770 can operate in a frequency range from approximately 1 MHz. to approximately 100 MHz., or the first RF source 770 can operate in a frequency range from approximately 20 MHz. to approximately 100 MHz. The first RF source 770 can operate in a power range from approximately 10 watts to approximately 10000 watts, or alternatively, the first RF source 770 can operate in a power range from approximately 10 watts to approximately 5000 watts Also, when etching a TERA layer, a BRF signal can be provided to the lower electrode 768 using the second RF source 775. For example, the second RF source 775 can operate in a frequency range from approximately 0.1 MHz. to approximately 200 MHz. Alternatively, the second RF source 775 can operate in a frequency range from approximately 0.2 MHz. to approximately 30 MHz, or the second RF source can operate in a frequency range from approximately 0.3 MHz. to approximately 15 MHz. The second RF source 775 can operate in a power range from approximately 0.0 watts to approximately 1000 watts, or alternatively, the second RF source 775 can operate in a power range from approximately 0.0 watts to approximately 500 watts. In an alternate embodiment, a BRF signal is not required.

In addition, a process gas can be provided to the processing chamber 710 using the shower plate 758. For example, the process gas can comprise an oxygen-containing gas and an inert gas. For example, the oxygen-containing gas can comprise $O_2$, CO, NO, $N_2O$, or $CO_2$, or a combination of two or more thereof, and the flow rate can range from approximately 0 sccm to approximately 10000 sccm. The inert gas can comprise argon, helium, or nitrogen, or a combination of two or more thereof, and the flow rate for the inert gas can range from approximately 0 sccm to approximately 10000 sccm.

Furthermore, the chamber pressure and substrate temperature can be controlled during the etching of the TERA layer. For example, the chamber pressure can range from approximately 0.1 mTorr to approximately 100.0 mTorr, and the substrate temperature can range from approximately 0° C. to approximately 500° C.

During the oxidation of the features of a TERA layer, the substrate can be placed on the substrate holder 730 in a processing chamber 710. For example, the processing chamber 710 can be chosen based on the gap size between the upper electrode surface 725 and a surface of the substrate holder 730. The gap can range from approximately 10 mm to approximately 200 mm, or alternatively, the gap can range from approximately 150 mm to approximately 190 mm. In alternate embodiments, the gap size can be selected from a wide variety of predetermined values.

During the oxidation of the features of a TERA layer, a TRF signal can be provided to the upper electrode 725 using the first RF source 770. For example, the first RF source 770 can operate in a frequency range from approximately 0.1 MHz. to approximately 200 MHz. Alternatively, the first RF source 770 can operate in a frequency range from approximately 1 MHz. to approximately 100 MHz. or the first RF source 770 can operate in a frequency range from approximately 20 MHz. to approximately 100 MHz. The first RF source 770 can operate in a power range from approximately 10 watts to approximately 10000 watts, or alternatively, the first RF source 770 can operate in a power range from approximately 10 watts to approximately 5000 watts Also, when oxidizing the features of a TERA layer, a BRF signal can be provided to the lower electrode 768 using the second RF source 775. For example, the second RF source 775 can operate in a frequency range from approximately 0.1 MHz. to approximately 200 MHz. Alternatively, the second RF source 775 can operate in a frequency range from approximately 0.2 MHz. to approximately 30 MHz. or the second RF source can operate in a frequency range from approximately 0.3 MHz. to approximately 15 MHz. The second RF source 775 can operate in a power range from approximately 0.0 watts to approximately 1000 watts, or alternatively, the second RF source 775 can operate in a power range from approximately 0.0 watts to approximately 500 watts. In an alternate embodiment, a BRF signal is not required.

In addition, when oxidizing the features of a TERA layer, a process gas can be provided to the processing chamber 710 using the shower plate 758. For example, the process gas can comprise an oxygen-containing gas and/or an inert gas. For example, the oxygen containing gas can comprise $O_2$, CO, NO, $N_2O$, or $CO_2$, or a combination of two or more thereof, and the flow rate can range from approximately 0.0 sccm to approximately 10000 sccm. The inert gas can comprise argon, helium, or nitrogen, or a combination of two or more thereof, and the flow rate for the inert gas can range from approximately 0 sccm to approximately 10000 sccm. Furthermore, the chamber pressure and substrate temperature can be controlled when oxidizing the features of a TERA layer. For example, the chamber pressure can range from approximately 0.1 mTorr to approximately 100.0 Torr, and the substrate temperature can range from approximately 0° C. to approximately 500° C.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not meant or intended to, in any way, limit the invention—rather the scope of the invention is defined by the appended claims. Moreover, where list are provided herein, those lists are intended to be exemplary only. Being open-ended, the list is not meant to limit the scope of the invention solely to the specific embodiments enumerated. To the contrary, as should be appreciated by those skilled in the art, further components, stages, arrangements, etc. may be easily added or substituted without departing from the intended scope of the invention.

What is claimed is:

1. A method of processing a Tunable Etch Rate ARC (TERA) layer on a substrate, the method comprising:
   depositing the TERA layer on the substrate using a plasma-enhanced chemical vapor deposition (PECVD) system;
   creating features in the TERA layer using an etching system; and
   reducing the size of the features in the TERA layer.

2. The method of claim 1, further comprising:
   positioning the substrate on a substrate holder in a processing chamber within the PECVD system; and
   providing a process gas to the processing chamber, wherein the process gas comprises an inert gas and one of a silicon-containing precursor or a carbon-containing precursor.

3. The method of claim 2, further comprising:
   establishing a gap between an upper electrode surface and a surface of the substrate holder, wherein the PECVD system comprises an upper electrode coupled to the processing chamber and the substrate holder comprises a translation device.

4. The method of claim 3, wherein the gap ranges from approximately 10 mm to approximately 200 mm.

5. The method of claim 3, further comprising:
   coupling a first RF source to the upper electrode;
   operating the first RF source in a frequency range from approximately 0.1 MHz. to approximately 200 MHz.; and
   operating the first RF source in a power range from approximately 10 watts to approximately 10000 watts.

6. The method of claim 5, further comprising:
   coupling a second RF source to the substrate holder;
   operating the second RF source in a frequency range from approximately 0.1 MHz. to approximately 200 MHz.; and
   operating the second RF source in a power range from approximately 10 watts to approximately 10000 watts.

7. The method of claim 3, further comprising:
   coupling an RF source to the substrate holder;
   operating the RF source in a frequency range from approximately 0.1 MHz. to approximately 200 MHz.; and
   operating the RF source in a power range from approximately 10 watts to approximately 10000 watts.

8. The method of claim 2, wherein the silicon-containing precursor comprises monosilane (SiH4), tetraethylorthosilicate (TEOS), monomethylsilane (1MS), dimethylsilane (2MS), trimethylsilane (3MS), tetramethylsilane (4MS), octamethylcyclotetrasiloxane (OMCTS), dimethyi-dimethoxysilane (DMDMOS), or tetramethylcyclotetrasilane (TMCTS), or a combination of two or more thereof.

9. The method of claim 2, wherein the carbon-containing precursor comprises $CH_4$, $C_2H_4$, $C_2H_2$, $C_6H_6$, or $C_6H_5OH$, or a combination of two or more thereof.

10. The method of claim 2, wherein the first process gas includes an inert gas comprising argon, helium, or nitrogen, or a combination of two or more thereof.

11. The method of claim 1, wherein the TERA layer comprises a SiCOH material, or a SiCH material, or a combination thereof.

12. The method of claim 1, wherein the TERA layer comprises a material having a refractive index (n) ranging from approximately 1.5 to approximately 2.5 when measured at a wavelength of at least one of 248 nm, 193 nm, or 157 nm, and having an extinction coefficient (k) ranging from approximately 0.10 to approximately 0.9 when measured at a wavelength of at least one of 248 nm, 193 nm, or 157 nm.

13. The method of claim 1, further comprising:
   positioning the substrate on a substrate holder in a processing chamber in the etching system;
   providing a process gas to the processing chamber, wherein the process gas comprises an oxygen-containing gas and an inert gas; and
   establishing plasma to create the features in the TERA layer.

14. The method of claim 1, further comprising:
   providing a photoresist layer on the substrate;
   transferring a pattern into the photoresist layer;
   creating features in the photoresist layer by developing the photoresist layer; and
   transferring the features into the TERA layer using an etch process.

15. The method of claim 14, further comprising:
   determining a trimming amount;
   oxidizing exposed surfaces of the features in the TERA layer, wherein the trimming amount is used to control the oxidation process; and
   removing the oxidized portion of the TERA features, wherein the removal process comprises a chemical oxide removal (COR) process.

16. The method of claim 1, further comprising:
   providing a photoresist layer on the substrate;
   transferring a pattern into the photoresist layer;
   creating features in the photoresist layer by developing the photoresist layer;
   transferring the features into the TERA layer using an etch process; and
   removing the photoresist layer.

17. The method of claim 16, further comprising:
   determining a trimming amount;
   oxidizing exposed surfaces of the features in the TERA layer, wherein the trimming amount is used to control the oxidation process; and
   removing the oxidized portion of the TERA features, wherein the removal process comprises a chemical oxide removal (COR) process.

18. The method of claim 1, further comprising:

determining a trimming amount;

oxidizing exposed surfaces of the features in the TERA layer, wherein the trimming amount is used to control the oxidation process; and removing the oxidized portion of the TERA features, wherein the removal process comprises a chemical oxide removal (COR) process.

19. The method of claim 18, further comprising:

chemically treating the exposed surfaces of the features using a COR module by providing a process gas, wherein a solid reaction product having a thickness approximately equal to the trimming amount is formed on at least one of the oxidized exposed surfaces of the features in the TERA layer; and executing a post heat treatment (PHT) process using a PHT module by evaporating the solid reaction product, thereby trimming at least one of the features in the TERA layer by the trimming amount.

20. The method of claim 19, wherein the process gas comprises an oxygen-containing gas, a nitrogen containing gas, a fluorine-containing gas, or a chlorine-containing gas, or a combination of two or more thereof.

21. The method of claim 20, wherein the process gas comprises HF and $NH_3$.

* * * * *